(12) United States Patent
Shibata et al.

(10) Patent No.: US 10,559,547 B2
(45) Date of Patent: Feb. 11, 2020

(54) SEMICONDUCTOR CHIP

(71) Applicant: Murata Manufacturing Co., Ltd., Kyoto-fu (JP)

(72) Inventors: Masahiro Shibata, Nagaokakyo (JP);
Daisuke Tokuda, Nagaokakyo (JP);
Atsushi Kurokawa, Nagaokakyo (JP);
Hiroaki Tokuya, Nagaokakyo (JP);
Yasunari Umemoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/006,623

(22) Filed: Jun. 12, 2018

(65) Prior Publication Data

US 2019/0006306 A1    Jan. 3, 2019

(30) Foreign Application Priority Data

Jun. 28, 2017  (JP) ................................. 2017-126545
Dec. 26, 2017  (JP) ................................. 2017-248970

(51) Int. Cl.
*H01L 23/48*    (2006.01)
*H01L 23/52*    (2006.01)
(Continued)

(52) U.S. Cl.
CPC .............. *H01L 24/14* (2013.01); *H01L 24/06* (2013.01); *H01L 24/13* (2013.01);
(Continued)

(58) Field of Classification Search
CPC .......... H01L 2224/73204; H01L 24/13; H01L 24/16; H01L 2224/0401; H01L 24/14;
(Continued)

(56) References Cited

U.S. PATENT DOCUMENTS 5,828,128 A * 10/1998 Higashiguchi .... H01L 23/49816
257/738
6,111,311 A *  8/2000 Suzuki ................... H01L 22/32
257/691

(Continued)

FOREIGN PATENT DOCUMENTS

CN         104934392 A    9/2015
JP         H09-129646 A   5/1997
JP         2007-096198 A  4/2007

*Primary Examiner* — S. V. Clark
(74) *Attorney, Agent, or Firm* — Studebaker & Brackett PC

(57) ABSTRACT

A semiconductor chip includes a semiconductor substrate having a main surface, first and second electrodes, a first insulating layer, and first and second bumps. The first and second electrodes are formed above the main surface of the semiconductor substrate. The first insulating layer is formed above a first portion of the first electrode. The first bump is formed above a second portion of the first electrode and above the first insulating layer and is electrically connected to the first electrode. The second bump is formed above the second electrode. The area of the second bump is larger than that of the first bump in a plan view of the main surface of the semiconductor substrate. The first insulating layer adjusts the distance from the main surface of the semiconductor substrate to the top surface of the first bump in a direction normal to the main surface.

19 Claims, 43 Drawing Sheets

(51) Int. Cl.
*H01L 29/40* (2006.01)
*H01L 23/00* (2006.01)

(52) U.S. Cl.
CPC ............. *H01L 2224/0401* (2013.01); *H01L 2224/05547* (2013.01); *H01L 2224/0603* (2013.01); *H01L 2224/13082* (2013.01); *H01L 2224/13147* (2013.01); *H01L 2224/1403* (2013.01); *H01L 2924/014* (2013.01)

(58) Field of Classification Search
CPC ............. H01L 24/17; H01L 33/38; H01L 2224/83851; H01L 2224/14051
USPC ................................ 257/780, 781, 758
See application file for complete search history.

(56) References Cited

U.S. PATENT DOCUMENTS

| | | | | |
|---|---|---|---|---|
| 6,316,735 | B1* | 11/2001 | Higashiguchi | H05K 3/3436 |
| | | | | 174/260 |
| 6,549,413 | B2* | 4/2003 | Karnezos | H01L 23/3128 |
| | | | | 165/185 |
| 6,586,844 | B1* | 7/2003 | Chang | H01L 24/06 |
| | | | | 257/779 |
| 7,564,130 | B1* | 7/2009 | Li | H01L 24/14 |
| | | | | 257/734 |
| 8,686,560 | B2* | 4/2014 | Parvarandeh | H01L 24/06 |
| | | | | 257/737 |
| 2015/0270220 | A1 | 9/2015 | Moon et al. | |

* cited by examiner

SEMICONDUCTOR CHIP

CROSS-REFERENCE TO RELATED APPLICATIONS

This application claims benefit of priority to Japanese Patent Application No. 2017-126545, filed Jun. 28, 2017, and Japanese Patent Application No. 2017-248970, filed Dec. 26, 2017, the entire contents of both are incorporated herein by reference.

BACKGROUND

Technical Field

The present disclosure relates to a semiconductor chip.

Background Art

A flip-chip technology using bumps is an example of methods for mounting a semiconductor chip on a substrate. In the flip-chip technology, to prevent a poor connection between a semiconductor chip and a substrate and also to improve the connection reliability by relaxing the stress applied to the bumps, it is desirable to make the heights of the bumps uniform. If the heights of the bumps are different, a low bump may not contact a pad on the substrate when the semiconductor chip is mounted on the substrate. This may cause a failure in electrical connection between the semiconductor chip and the substrate.

Japanese Unexamined Patent Application Publication No. 2007-96198 discloses a semiconductor device having the following configuration. The amount of solder to be applied to each bump is adjusted in accordance with the thickness of an intermediate layer formed on a semiconductor substrate so as to change the volume of each bump. With this configuration, the heights from the surface of the semiconductor device to the apexes of the bumps become uniform so that a poor connection between a semiconductor package and a substrate can be avoided.

SUMMARY

In the above-described flip-chip technology, in order to respond to smaller, higher-density electronic devices, more and more copper (Cu) pillar bumps are being used instead of solder bumps. The size and the pitch of Cu pillar bumps are smaller than those of solder bumps, and Cu pillar bumps exhibit higher heat dissipation and electrical characteristics. Typically, to form Cu pillar bumps, a Cu layer and a solder layer are sequentially formed by plating. Because of this configuration, the amount of solder to be applied to the Cu pillar bumps is restricted by the area of the Cu layer, which is a base layer. This makes it difficult to adjust the amount of solder to be applied to each bump, which is achieved by the technology disclosed in the above-described publication. Additionally, when the pitch of bumps is small, it may be difficult to make the heights of bumps uniform by controlling the amount of solder to be applied to each bump.

In view of the above-described background, the present disclosure provides a semiconductor chip in which the heights of bumps can be made substantially uniform without depending on the control of the amount of solder to be applied to the bumps.

A preferred embodiment of the present disclosure provides a semiconductor chip including a semiconductor substrate having a main surface, first and second electrodes, a first insulating layer, and first and second bumps. The first and second electrodes are formed above the main surface of the semiconductor substrate. The first insulating layer is formed above a first portion of the first electrode. The first bump is formed above a second portion of the first electrode and above the first insulating layer and is electrically connected to the first electrode. The second bump is formed above the second electrode. The area of the second bump is larger than that of the first bump in a plan view of the main surface of the semiconductor substrate. The level on which the first bump is formed is higher than that on which the second bump is formed.

According to another preferred embodiment of the present disclosure, there is provided a semiconductor chip including a semiconductor substrate having a main surface, first and second electrodes, a first insulating layer, and first and second bumps. The first and second electrodes are formed above the main surface of the semiconductor substrate. The first insulating layer is formed above a first portion of the first electrode. The first bump is formed above a second portion of the first electrode and above the first insulating layer and is electrically connected to the first electrode. The second bump is formed above the second electrode. The area of the second bump is larger than that of the first bump in a plan view of the main surface of the semiconductor substrate. The longest distance from the main surface of the semiconductor substrate to a top surface of the first bump in a direction normal to the main surface of the semiconductor substrate is substantially equal to the longest distance from the main surface of the semiconductor substrate to a top surface of the second bump in the direction normal to the main surface of the semiconductor substrate.

According to another preferred embodiment of the present disclosure, there is provided a semiconductor chip including a semiconductor substrate having a main surface, first and second semiconductor layers, a fourth insulating layer, and first and second bumps. The first semiconductor layer is formed above the main surface of the semiconductor substrate and does not form a transistor. The second semiconductor layer is formed above the main surface of the semiconductor substrate and forms a base layer of a transistor. The fourth insulating layer is formed above the first semiconductor layer. The first bump is formed above the fourth insulating layer. The second bump is formed above the second semiconductor layer. The area of the second bump is larger than that of the first bump in a plan view of the main surface of the semiconductor substrate.

According to preferred embodiments of the present disclosure, it is possible to provide a semiconductor chip in which the heights of bumps can be made substantially uniform without depending on the control of the amount of solder to be applied to the bumps.

Other features, elements, characteristics and advantages of the present disclosure will become more apparent from the following detailed description of preferred embodiments of the present disclosure with reference to the attached drawings.

DETAILED DESCRIPTION

Figure 1:
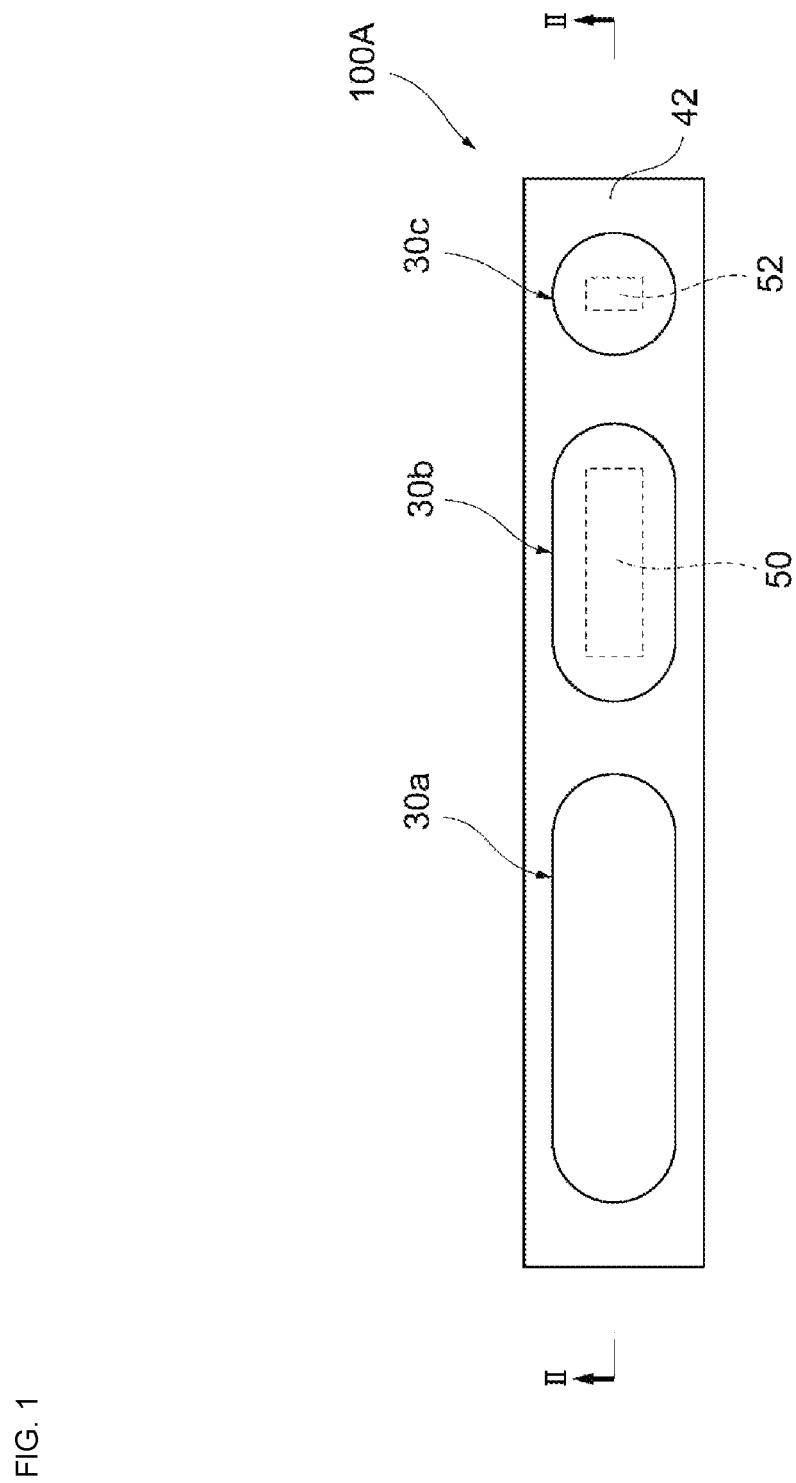
FIG. 1 is a plan view of a semiconductor chip according to a first embodiment of the disclosure.

Preferred embodiments of the disclosure will be described below with reference to the accompanying drawings. In the drawings, the same elements or similar elements are designated by the same or like reference numerals. The drawings are only examples, and the dimensions and the configurations of the individual elements are illustrated merely schematically. The embodiments are not intended to be exhaustive or to limit the technical scope of the disclosure.

Figure 2:
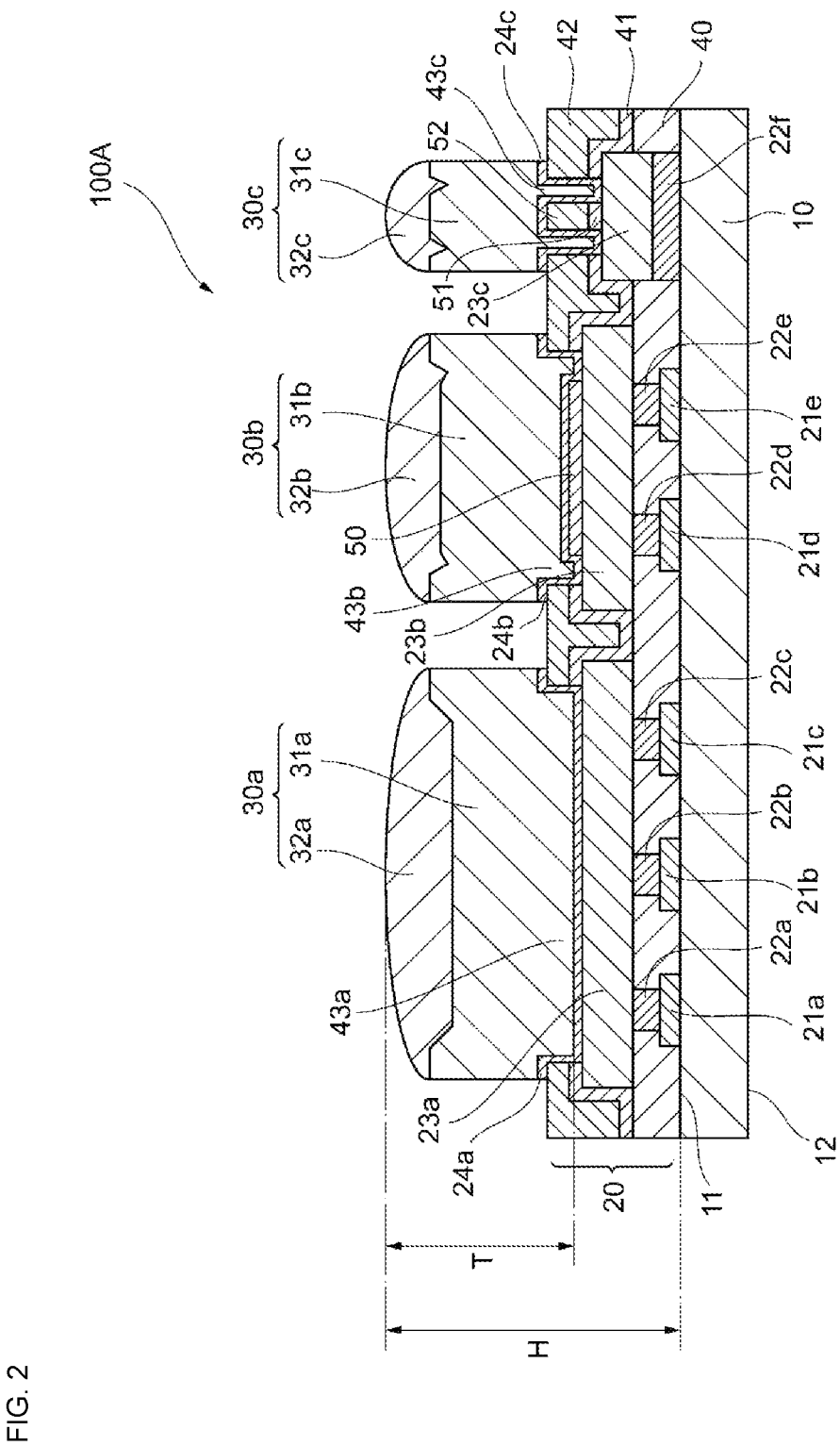
FIG. 2 is a sectional view taken along line II-II of FIG. 1.

A semiconductor chip 100A according to a first embodiment of the disclosure will first be described below with reference to FIGS. 1 and 2. FIG. 1 is a plan view of the semiconductor chip 100A according to the first embodiment. FIG. 2 is a sectional view taken along line II-II of FIG. 1.

As shown in FIG. 2, the semiconductor chip 100A includes a semiconductor substrate 10, a circuit forming region 20 formed on the semiconductor substrate 10, and plural copper (Cu) pillar bumps 30a, 30b, and 30c. The semiconductor substrate 10 is formed in a substantially planar shape and has main surfaces 11 and 12 which oppose each other. The material for the semiconductor substrate 10 is not restricted to a particular material, and contains a compound semiconductor, for example, as the principal component. FIG. 1 illustrates the semiconductor chip 100A when viewing the main surface 11 of the semiconductor substrate 10 from above.

In the circuit forming region 20, active elements such as transistors, passive elements such as resistor elements, capacitor elements, and inductor elements, wiring, insulating film, and passivation film are formed. By suitably combining these active elements, passive elements, wiring, insulating film, and passivation film, an electrical circuit is formed. In the first embodiment, plural transistors 21a through 21e are formed in the circuit forming region 20, and plural electrodes 22a through 22e are formed on the transistors 21a through 21e, respectively. An electrode 23a is formed on the electrodes 22a through 22c, while an electrode 23b is formed on the electrodes 22d and 22e. In the region where no transistors are formed, electrodes 22f and 23c are sequentially stacked on the main surface 11 of the semiconductor substrate 10.

The region surrounding the plural transistors 21a through 21e and the plural electrodes 22a through 22f is filled with an insulating layer 40. On the insulating layer 40 and the plural electrodes 23a through 23c, insulating layers 41 and 42 are sequentially stacked as a protective film. The insulating layers 41 and 42 have cavities 43a through 43c to provide electrical connection between the Cu pillar bumps 30a through 30c and the electrodes 23a through 23c, respectively. The materials for the insulating layers 40 through 42 are not restricted to particular materials. The insulating layers 40 and 42 contain resin, for example, as the principal component, while the insulating layer 41 contains SiN, for example, as the principal component. The insulating layers 40 through 42 may contain $SiO_2$, polyimide resin, polybenzoxazole (PBO) resin, benzocyclobutene (BCB) resin, or epoxy resin, for example, as the principal component.

Plating seed layers 24a through 24c are respectively formed on the plural electrodes 23a through 23c. The plating seed layers 24a through 24c are formed on the electrodes 23a through 23c and insulating layers 50 and 52, which will be discussed later, and also along the inner wall surfaces of the cavities 43a through 43c. The formation of the plating seed layers 24a through 24c will be discussed more specifically. The plating seed layer 24a is formed on the bottom portion of the cavity 43a on the electrode 23a and the inner wall surface of the cavity 43a. The plating seed layer 24b is formed on the insulating layer 50 formed on one part (first portion) of the electrode 23b and on another part (second portion) of the electrode 23b without the insulating layer 50 and is also formed along the inner wall surface of the cavity 43b. The plating seed layer 24c is formed on the insulating layer 52 formed on one part (first portion) of the electrode 23c and on another part (second portion) of the electrode 23c without the insulating layer 52 and is also formed along the inner wall surface of the cavity 43c. By forming thin metal layers, that is, the plating seed layers 24a through 24c, the Cu pillar bumps 30b and 30c can be formed above the insulating layers 50 and 52 by plating.

The Cu pillar bumps 30a through 30c are formed on the plating seed layers 24a through 24c, respectively. The Cu pillar bump 30a is formed above the electrode 23a with the plating seed layer 24a interposed therebetween. The Cu pillar bump 30b is formed above the electrode 23b with the plating seed layer 24b interposed therebetween. The Cu pillar bump 30c is formed above the electrode 23c with the plating seed layer 24c interposed therebetween. The Cu pillar bumps 30a through 30c are thoroughly formed into the cavities 43a through 43c so as to match the configurations of the plating seed layers 24a through 24c, respectively. The Cu pillar bumps 30a through 30c are thus electrically connected to the electrodes 23a through 23c via the plating seed layers 24a through 24c, respectively. When mounting the semiconductor chip 100A on a substrate, the Cu pillar bumps 30a through 30c electrically connect the semiconductor chip 100A to an external device while fixing the semiconductor chip 100A onto the substrate. In terms of the relationship between the Cu pillar bumps 30a and 30b, the Cu pillar bump 30a is a specific example of a second bump, the plating seed layer 24a is a specific example of a second metal layer, and the electrode 23a is a specific example of a second electrode, while the Cu pillar bump 30b is a specific example of a first bump, the plating seed layer 24b is a specific example of a first metal layer, and the electrode 23b is a specific example of a first electrode. In terms of the relationship between the Cu pillar bumps 30b and 30c, the Cu pillar bump 30b is a specific example of the second bump, the plating seed layer 24b is a specific example of the second metal layer, and the electrode 23b is a specific example of the second electrode, while the Cu pillar bump 30c is a specific example of the first bump, the plating seed layer 24c is a specific example of the first metal layer, and the electrode 23c is a specific example of the first electrode.

As shown in FIG. 1, the configurations of the Cu pillar bumps 30a and 30b in a plan view of the main surface 11 of the semiconductor substrate 10 (which may hereinafter be simply called the planar configurations of the Cu pillar bumps) are substantially ellipses having a length in the major axis direction and a width in the minor axis direction. The planar configuration of the Cu pillar bump 30c is a substantially circle. In the first embodiment, the areas of the Cu pillar bumps 30a through 30c in a plan view of the main surface 11 of the semiconductor substrate 10 (which may hereinafter be simply called the areas of the Cu pillar bumps) are different from each other, as shown in FIG. 1. More specifically, the area of the Cu pillar bump 30a is larger than that of the Cu pillar bump 30b. The area of the Cu pillar bump 30b is larger than that of the Cu pillar bump 30c. That is, the Cu pillar bump 30c has the smallest area. In this manner, the planar configurations and the areas of the Cu pillar bumps can be formed as desired.

As shown in FIG. 2, the Cu pillar bumps 30a through 30c are formed in a double structure in which solder layers 32a through 32c made of solder as the principal component are respectively stacked on Cu layers 31a through 31c formed in a columnar shape and made of Cu as the principal component. The material for the solder layers 32a through 32c is not restricted to a particular material, and may be SnAg, SnAgCu, SnCu, or SnPb, for example. As described above, the Cu layer of a Cu pillar bump is formed in a columnar shape as a base for a solder layer. This configuration makes it possible to reduce the size and the pitch of Cu pillar bumps to be smaller than bumps only made of solder. Hence, Cu pillar bumps can suitably respond to smaller, higher-density electronic devices. Additionally, heat dissipation and electrical characteristics of Cu pillar bumps are higher than those of solder bumps.

In this specification, as shown in FIG. 2, in a direction normal to the main surface 11 of the semiconductor substrate 10, the length from the bottom surface of the Cu pillar bump 30a, that is, the boundary between the plating seed layer 24a and the Cu layer 31a, to the top surface of the Cu pillar bump 30a, that is, the top surface of the solder layer 32a, will be called the thickness T of the Cu pillar bump 30a. In the same direction normal to the main surface 11 of the semiconductor substrate 10, the length from the main surface 11 of the semiconductor substrate 10 to the top surface of the Cu pillar bump 30a will be called the height H of the Cu pillar bump 30a. The thickness T and the height H of the other Cu pillar bumps and the other elements may also be defined in a similar manner.

Cu pillar bumps are typically formed by plating. In this case, if the areas of the Cu pillar bumps are different, the amount of a plating solution and the plating current distribution also become different, which makes the thickness of the Cu pillar bumps nonuniform. Additionally, if the heights of circuit forming regions are not uniform because of the differences among the elements formed in the circuit forming regions, the heights of the bumps do not become uniform. The nonuniformity of the heights of the bumps in the same semiconductor chip may fail to connect the semiconductor chip to a substrate uniformly. For example, a low bump may not contact a pad on the substrate, which may cause a failure in electrical connection between the semiconductor chip and the substrate. Additionally, a stress may locally concentrate on some bumps, which may decrease the reliability in connecting the semiconductor chip and the substrate.

In contrast, in the semiconductor chip 100A, to adjust the heights of the Cu pillar bumps 30a through 30c, the insulating layer 50 is inserted between the electrode 23b and the Cu pillar bump 30b which is smaller than the Cu pillar bump 30a, and the insulating layers 51 and 52 are inserted between the electrode 23c and the Cu pillar bump 30c which is smaller than the Cu pillar bump 30a. More specifically, the Cu pillar bump 30a having the largest area is thicker than the Cu pillar bumps 30b and 30c, and thus, no insulating layer is formed for the Cu pillar bump 30a. Regarding the Cu pillar bump 30b having the intermediate size, the insulating layer 50 is formed at the central portion of the electrode 23b as viewed from above, that is, on one part (first portion) of the electrode 23b. Regarding the Cu pillar bump 30c having the smallest area, the insulating layers 51 and 52 are stacked on each other at the central portion of the electrode 23c as viewed from above, that is, on one part (first portion) of the electrode 23c. In terms of the relationship between the Cu pillar bumps 30a and 30b, the insulating layer 50 is a specific example of a first insulating layer. In terms of the relationship between the Cu pillar bumps 30b and 30c, the insulating layer 50 is a specific example of a second insulating layer, the insulating layer 51 is a specific example of the first insulating layer, and the insulating layer 52 is a specific example of a third insulating layer.

The insulating layer 50 adjusts the height of the Cu pillar bump 30b, while the insulating layers 51 and 52 adjust the height of the Cu pillar bump 30c. The top surface of the portion where the insulating layer 50 is formed under the plating seed layer 24b is defined as a level on which the Cu pillar bump 30b is formed. Likewise, the top surface of the portion where the insulating layers 51 and 52 are formed under the plating seed layer 24c is defined as a level on which the Cu pillar bump 30c is formed. The levels on which the Cu pillar bumps 30a, 30b, and 30c are formed are different from each other. The Cu pillar bump 30c is formed on the highest level, while the Cu pillar bump 30a is formed on the lowest level. The adjustment of the levels on which the Cu pillar bumps 30b and 30c are formed compensates for the difference in the thickness among the Cu pillar bumps 30a, 30b, and 30c originating from the difference in the area of the Cu pillar bumps 30a, 30b, and 30c. In the direction normal to the main surface 11 of the semiconductor substrate 10, the longest distances from the main surface 11 to the top surfaces of the Cu pillar bumps 30a, 30b, and 30c are equal to each other. "Being equal to each other" does not necessarily mean that the heights of the Cu pillar bumps are exactly equal to each other, and may allow a small difference if the Cu pillar bumps are uniformly connected to a substrate when mounting the semiconductor chip 100A on the substrate.

With the above-described configuration of the semiconductor chip 100A, even with a difference in the area among the Cu pillar bumps 30a through 30c or a difference in the height of the circuit forming region 20, the heights of the Cu pillar bumps 30a through 30c can be made substantially uniform by the insertion of an insulating layer or the adjustment of the number of insulating layers without depending on the control of the amount of solder to be applied to the bumps. Hence, the plural Cu pillar bumps 30a through 30c can uniformly be connected to a substrate when mounting the semiconductor chip 100A on the substrate. This can prevent a poor connection between the Cu pillar bumps 30a through 30c and the substrate and also improve the connection reliability because of stress relaxation.

The use of the Cu pillar bumps 30a through 30c makes it possible to form the planar configuration of the Cu layers 31a through 31c as desired. Among the elements formed in the circuit forming region 20, the relatively larger Cu pillar bumps 30a and 30b may be disposed above the transistors 21a through 21e which generate a relatively large amount of heat, while the relatively small, columnar Cu pillar bump 30c may be formed above the electrodes 22f and 23c.

The materials for the insulating layers 50 through 52 are not restricted to particular materials. It is preferable, however, that the insulating layers 50 and 51 be made of the same material as the insulating layer 41 and that the insulating layer 52 be made of the same material as the insulating layer 42. This makes it possible to form the insulating layers 50 and 51 in the same step of forming the insulating layer 41 and to form the insulating layer 52 in the same step of forming the insulating layer 42, which will be discussed later. In this manner, the insulating layers 50 through 52 can be formed with only a simple design change.

The adjustment of the heights of the Cu pillar bumps 30a through 30c is not restricted to inserting of an insulating layer or adjusting of the number of insulating layers. For example, adjusting of the thicknesses of the insulating layers 50 through 52 to be inserted between the electrodes 23a through 23c and the Cu pillar bumps 30a through 30c may make the heights of the Cu pillar bumps 30a through 30c substantially uniform. More specifically, by forming an insulating layer to be placed under a relatively small Cu pillar bump to be thicker than that under a relatively large Cu pillar bump, the heights of Cu pillar bumps may be made substantially uniform. In the example in FIG. 2, the thickness of the insulating layers 50 and 51 may be about 0 to 1 µm, while the thickness of the insulating layer 52 may be about 1 to 5 µm. Then, the heights of the Cu pillar bumps 30b and 30c can be adjusted by a range of about 0 to 6 µm depending on a combination of the insulating layers 50 through 52.

Alternatively, adjusting of the ratio of the area of an insulating layer to that of a Cu pillar bump (hereinafter may simply be called the ratio of the insulating layer) may make the heights of Cu pillar bumps substantially uniform. More specifically, insulating layers are formed so that the ratio of an insulating layer to be placed under a relatively small Cu pillar bump will be greater than that under a relatively large Cu pillar bump, thereby making the Cu pillar bumps substantially uniform. A higher ratio of an insulating layer increases the electrical resistivity between a Cu pillar bump and an electrode, which may cause deterioration of the characteristics of the semiconductor chip. It is thus preferable that the maximum ratio of the area of an insulating layer to that of a Cu pillar bump be about 80%.

Figure 3:
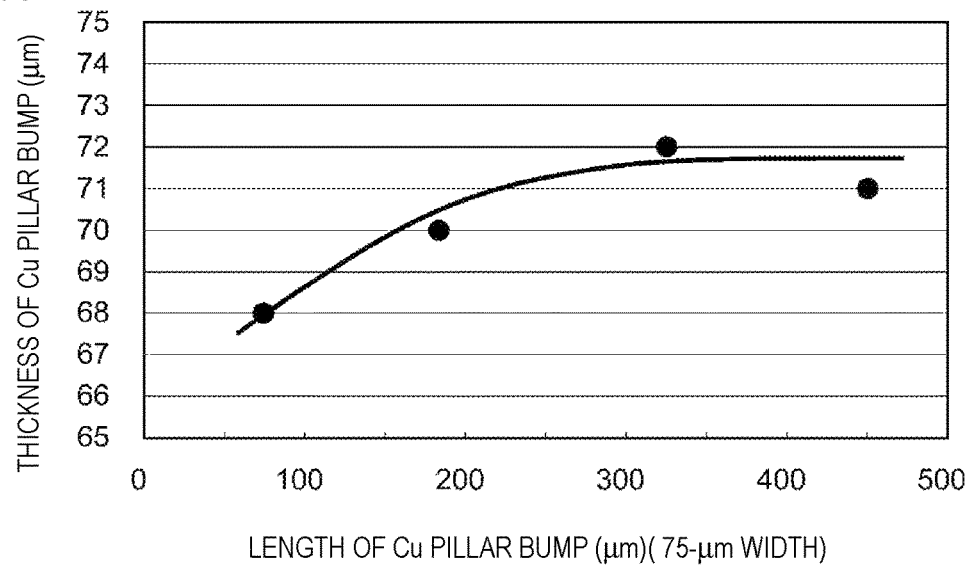
FIG. 3 is a graph illustrating the measured thicknesses of four Cu pillar bumps having different areas.

FIG. 3 is a graph illustrating the measured thicknesses of four Cu pillar bumps having different areas. In the graph in FIG. 3, the horizontal axis indicates the length (µm) of the major axis of the planar configuration of the Cu pillar bump when the width of the minor axis is about 75 µm, while the vertical axis indicates the thickness (µm) of the Cu pillar bump. The thickness of the Cu pillar bump in FIG. 3 is the average of the thicknesses of the Cu pillar bump when an insulating layer for adjusting the thickness of the Cu pillar bump is not formed.

As shown in FIG. 3, in a region where the length of the planar configuration of the Cu pillar bump is about 300 µm or smaller, the Cu pillar bump becomes thicker in accordance with an increase in the area of the Cu pillar bump. More specifically, comparing the Cu pillar bump having a length of about 75 µm and that having a length of about 325 µm, the difference in the thickness between the two Cu pillar bumps is found to be about 4 µm. Accordingly, if the height of a Cu pillar bump is increased by about 4 µm by inserting an insulating layer, the heights of Cu pillar bumps having different areas can be made substantially uniform.

Figure 4:
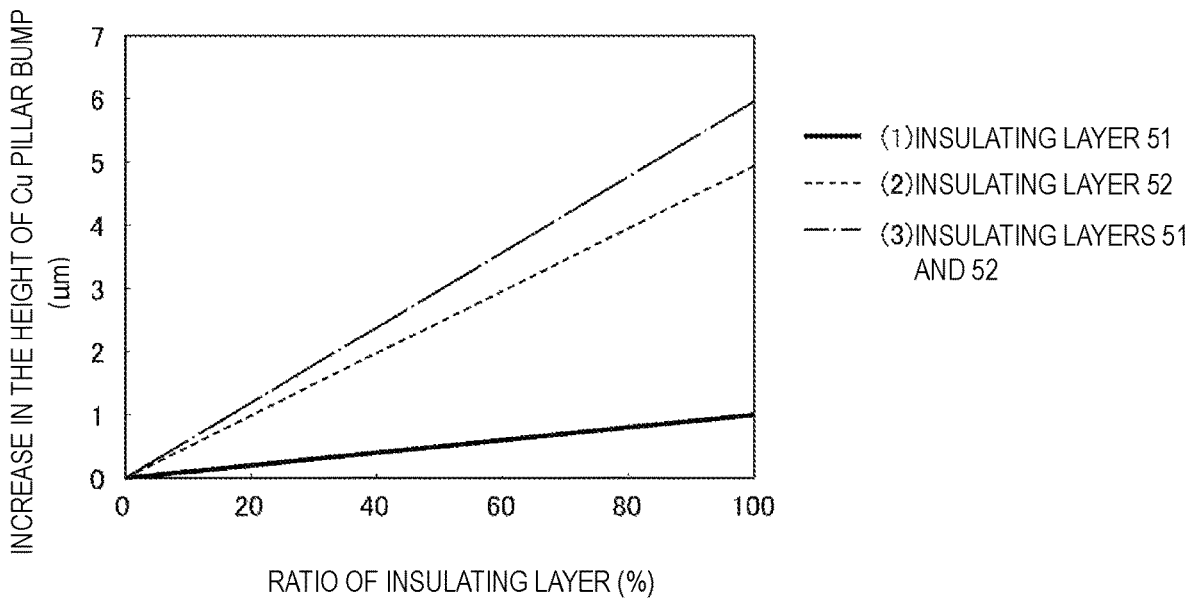
FIG. 4 is a graph illustrating simulation results of an increase in the height of a Cu pillar bump in accordance with the ratio of the area of an insulating layer to that of the Cu pillar bump.

FIG. 4 is a graph illustrating simulation results of an increase in the height of a Cu pillar bump in accordance with the ratio of the area of an insulating layer to that of the Cu pillar bump. More specifically, FIG. 4 illustrates an increase in the height of a Cu pillar bump when the ratio of the insulating layer is changed from 0 to 100% in cases in which (1) only the insulating layer 51 in FIG. 2 is inserted, (2) only the insulating layer 52 in FIG. 2 is inserted, and (3) the insulating layers 51 and 52 are inserted. When the ratio of the insulating layer is 0%, no insulating layers are inserted. When the ratio of the insulating layer is 100%, the insulating layer is inserted between the electrode and the Cu pillar bump without any intervening element therebetween, and the electrode and the Cu pillar bump are insulated from each other. In the graph in FIG. 4, the horizontal axis indicates the ratio (%) of the insulating layer, while the vertical axis indicates an increase (µm) in the height of the Cu pillar bump.

FIG. 4 shows that, regardless of which insulating layer is inserted, an increase in the height of the Cu pillar bump is progressively changed in accordance with a change in the ratio of the insulating layer. This proves that changing of the ratio of the insulating layer can make fine adjustments to the increase in the height of the Cu pillar bump. FIG. 4 also shows that, when the ratio of the insulating layer is about 80%, an increase in the height of the Cu pillar bump by about 5 µm is achieved. If the largest difference in the thickness among plural Cu pillar bumps is about 4 µm, as shown in FIG. 3, the heights of all the Cu pillar bumps can be made substantially uniform.

Figure 5:
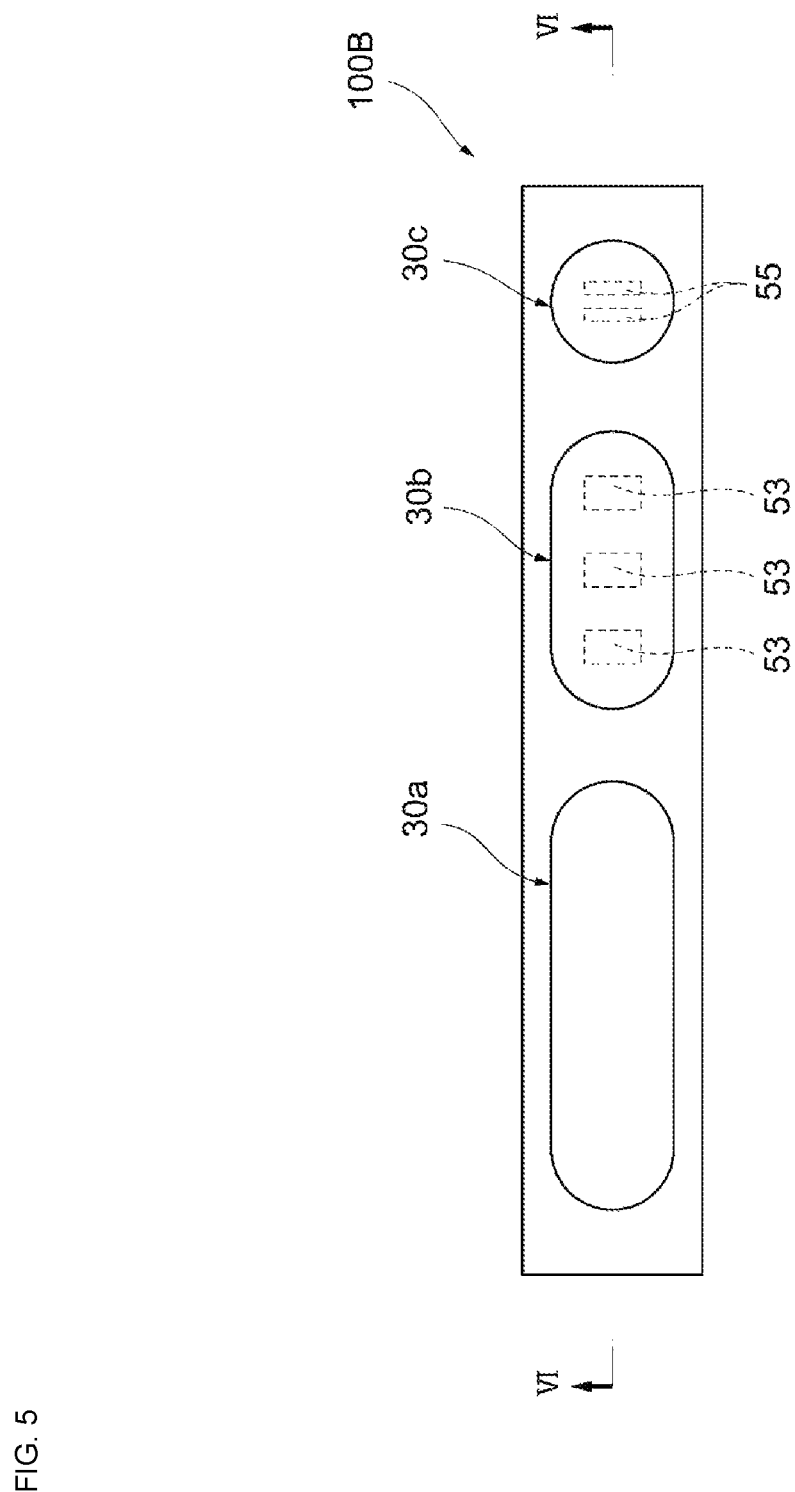
FIG. 5 is a plan view of a semiconductor chip according to a second embodiment of the disclosure.
Figure 6:
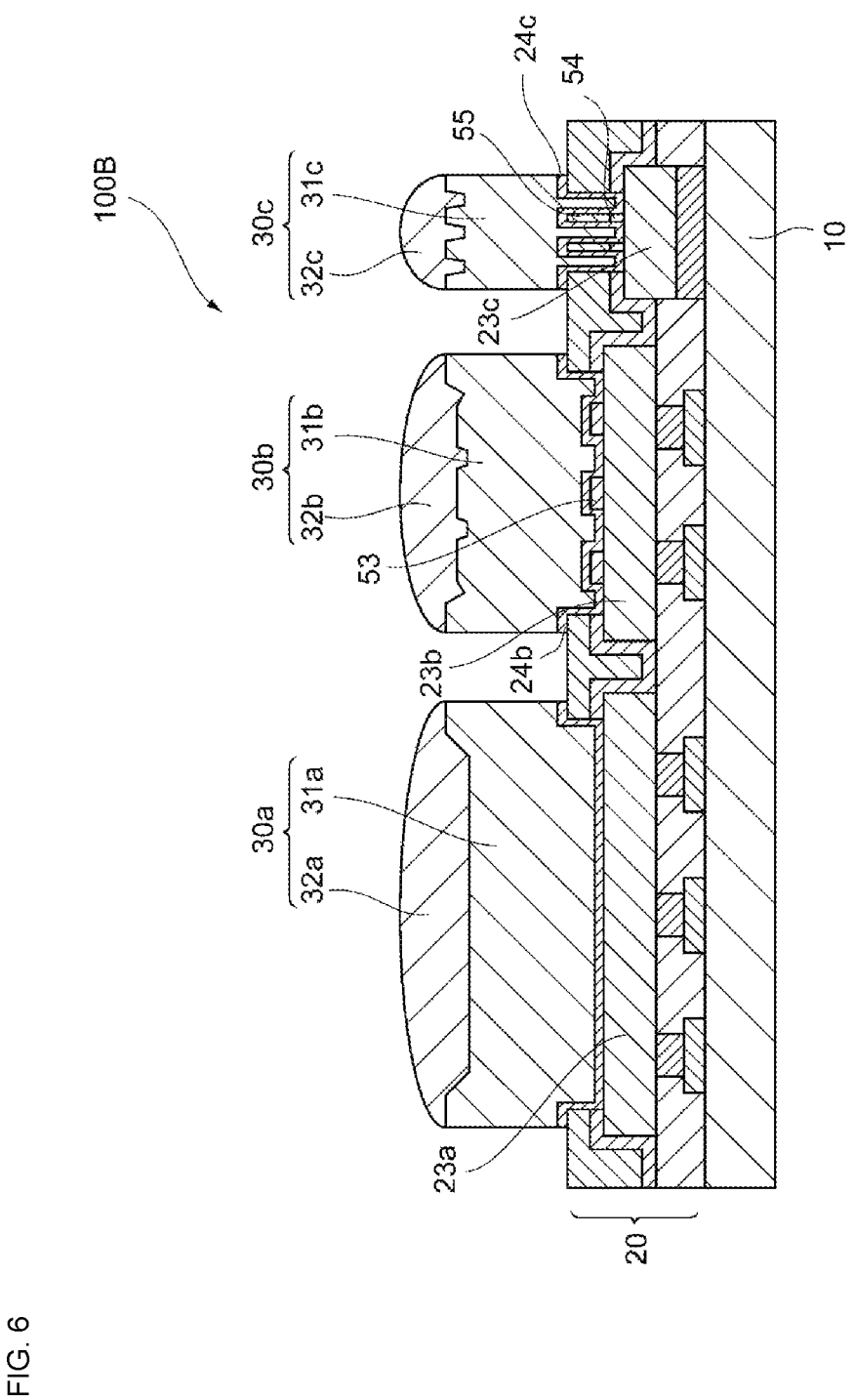
FIG. 6 is a sectional view taken along line VI-VI of FIG. 5.

A semiconductor chip 100B according to a second embodiment will be described below with reference to FIGS. 5 and 6. FIG. 5 is a plan view of the semiconductor chip 100B according to the second embodiment. FIG. 6 is a sectional view taken along line VI-VI of FIG. 5. In the following description, an explanation of the same points as those of the first embodiment will be omitted, and only different points will be explained. An explanation of advantages similar to those obtained in the first embodiment will not be repeated. For the sake of description, the same elements as those of the first embodiment are designated by like reference numerals.

The semiconductor chip 100B is different from the semiconductor chip 100A in the structure of insulating layers placed under the Cu pillar bumps 30b and 30c. In the semiconductor chip 100A, as shown in FIG. 2, the single insulating layer 50 is placed under the Cu pillar bump 30b, while the two insulating layers 51 and 52 stacked on each other are placed under the Cu pillar bump 30c. In the semiconductor chip 100B, as shown in FIG. 6, plural insulating layers 53 are placed under the Cu pillar bump 30b, while plural insulating layers 54 and plural insulating layers 55 stacked on each other are placed under the Cu pillar bump 30c. The top surface of the portion where the insulating layers 53 is formed under the plating seed layer 24b is defined as a level on which the Cu pillar bump 30b is formed. Likewise, the top surface of the portion where the insulating layers 54 and 55 are formed under the plating seed layer 24c is defined as a level on which the Cu pillar bump 30c is formed. The levels on which the Cu pillar bumps 30a, 30b, and 30c are formed are different from each other. The Cu pillar bump 30c is formed on the highest level, while the Cu pillar bump 30a is formed on the lowest level.

More specifically, as shown in FIGS. 5 and 6, the three insulating layers 53 formed in the shape of a substantially rectangle in a plan view of the main surface 11 are arranged along the major axis of the Cu pillar bump 30b. Likewise, the two pairs of stacked insulating layers 54 and 55 formed in the shape of a substantially rectangle in a plan view of the main surface 11 are arranged at the central portion of the Cu pillar bump 30c. As shown in FIG. 6, the plating seed layer 24b is formed on the electrode 23b without the insulating layer 53, that is, on the second portion of the electrode 23b, and the Cu layer 31b is filled into the region on the plating seed layer 24b. With this configuration, the electrode 23b and the Cu pillar bump 30b are electrically connected to each other. Similarly, the plating seed layer 24c is formed on the electrode 23c without the insulating layers 54 and 55, that is, on the second portion of the electrode 23c, and the Cu layer 31c is filled into the region on the plating seed layer 24c. With this configuration, the electrode 23c and the Cu pillar bump 30c are electrically connected to each other.

The area of the insulating layer 50 shown in FIG. 1 is larger than the total area of the plural insulating layers 53 shown in FIG. 5. That is, the ratio of the insulating layer 50 is higher than that of the insulating layers 53. The height of the Cu pillar bump 30b in FIG. 1 can thus be made higher than that in FIG. 5. On the other hand, the thermal conductivity of an insulating layer is lower than that of a Cu layer, and an excessively high ratio of the insulating layer may decrease the dissipation of heat generated by a transistor. The electrical conductivity of an insulating layer is also lower than that of a Cu layer, and an excessively high ratio of the insulating layer may increase the electrical resistivity because of a decrease in the area by which the electrode and the Cu pillar bump are connected to each other. From this point of view, in the semiconductor chip 100B, the plural insulating layers 53 are separated from each other, and also, the plural pairs of insulating layers 54 and 55 are separated from each other. This configuration enhances heat dissipation and also regulates an increase in the electrical resistivity in comparison with the semiconductor chip 100A. Hence, the semiconductor chip 100B does not cause characteristic deterioration as much as the semiconductor chip 100A while still making the heights of the Cu pillar bumps 30a through 30c substantially uniform.

Figure 7:
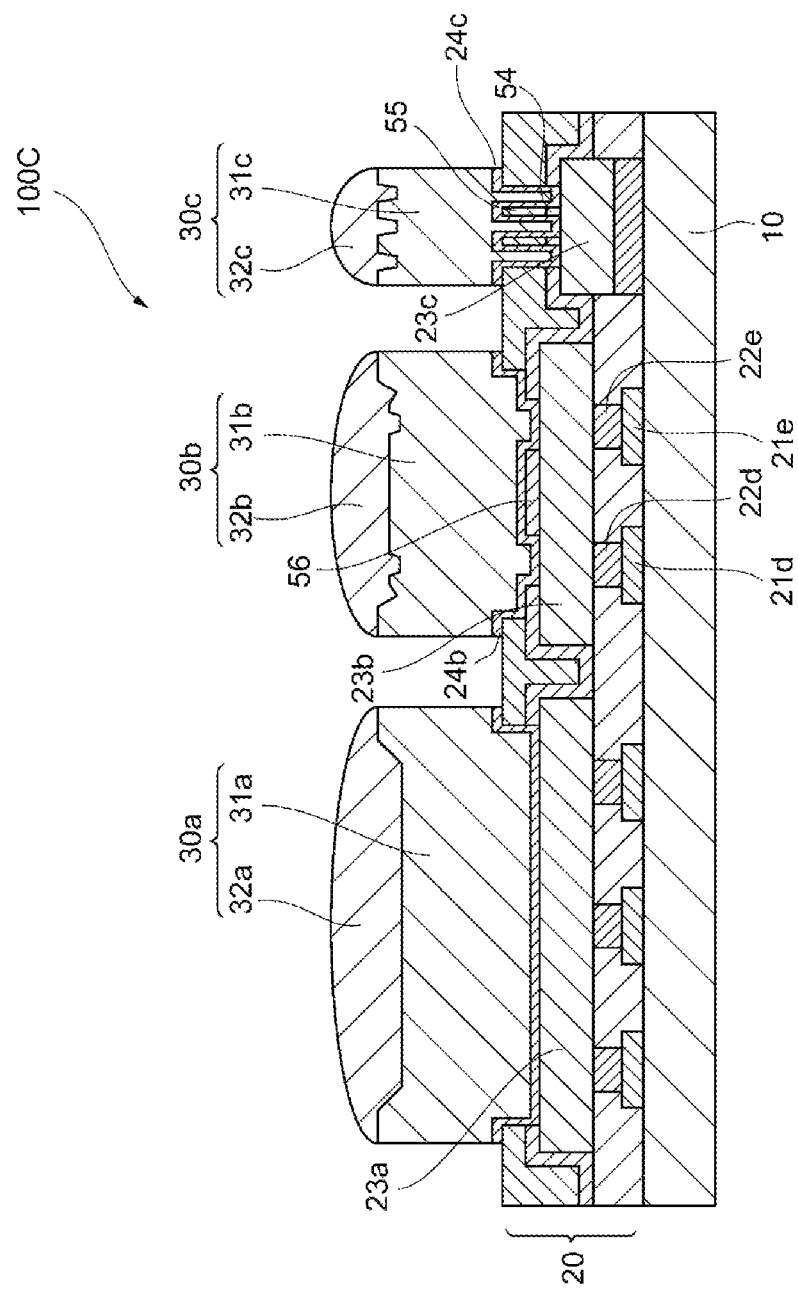
FIG. 7 is a sectional view of a semiconductor chip according to a third embodiment of the disclosure.

A semiconductor chip 100C according to a third embodiment will be described below with reference to FIG. 7. FIG. 7 is a sectional view of the semiconductor chip 100C cut along a direction similar to that in FIG. 2. The semiconductor chip 100C is different from the semiconductor chip 100B of the second embodiment in the structure of insulating layers placed under the Cu pillar bump 30b. The top surface of the portion where insulating layers 56 are formed under the plating seed layer 24b is defined as a level on which the Cu pillar bump 30b is formed. Likewise, the top surface of the portion where the insulating layers 54 and 55 are formed under the plating seed layer 24c is defined as a level on which the Cu pillar bump 30c is formed. The levels on which the Cu pillar bumps 30a, 30b, and 30c are formed are different from each other. The Cu pillar bump 30c is formed on the highest level, while the Cu pillar bump 30a is formed on the lowest level.

As shown in FIG. 7, in the semiconductor chip 100C, the insulating layers 56 are disposed so that the plating seed layer 24b and the Cu layer 31b can be positioned immediately above the transistors 21d and 21e with the electrodes 22d, 22e, and 23b interposed therebetween. The thermal conductivity of the insulating layers 56 is lower than that of the Cu layer 31b. The Cu layer 31b having a high thermal conductivity is formed immediately above the region where the transistors 21d and 21e, which generate a relatively large amount of heat, are disposed. The insulating layers 56 are formed above the region where the transistors 21d and 21e are not disposed. With this configuration, the height of the Cu pillar bump 30b can be adjusted while the heat dissipation characteristics of the Cu layer 31b are effectively utilized.

With this configuration of the semiconductor chip 100C, as well as that of the semiconductor chip 100A, the heights of the Cu pillar bumps 30a through 30c can be made substantially uniform without depending on the control of the amount of solder to be applied to the bumps. The semiconductor chip 100C enhances heat dissipation and does not cause characteristic deterioration as much as the semiconductor chip 100A.

Figure 8A:
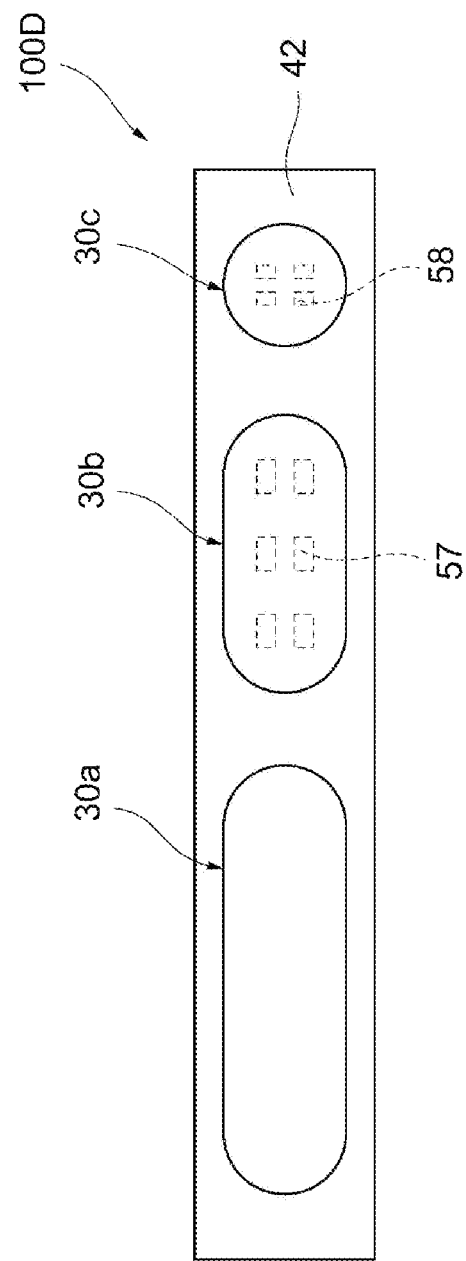
FIG. 8A is a plan view of a semiconductor chip according to a fourth embodiment of the disclosure.
Figure 8B:
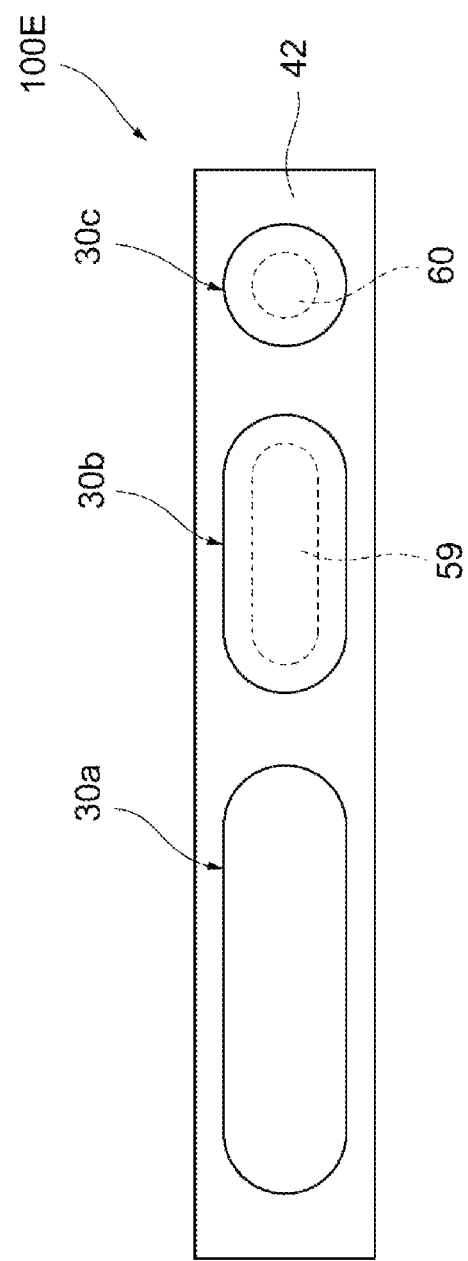
FIG. 8B is a plan view of a semiconductor chip according to a fifth embodiment of the disclosure.
Figure 8C:
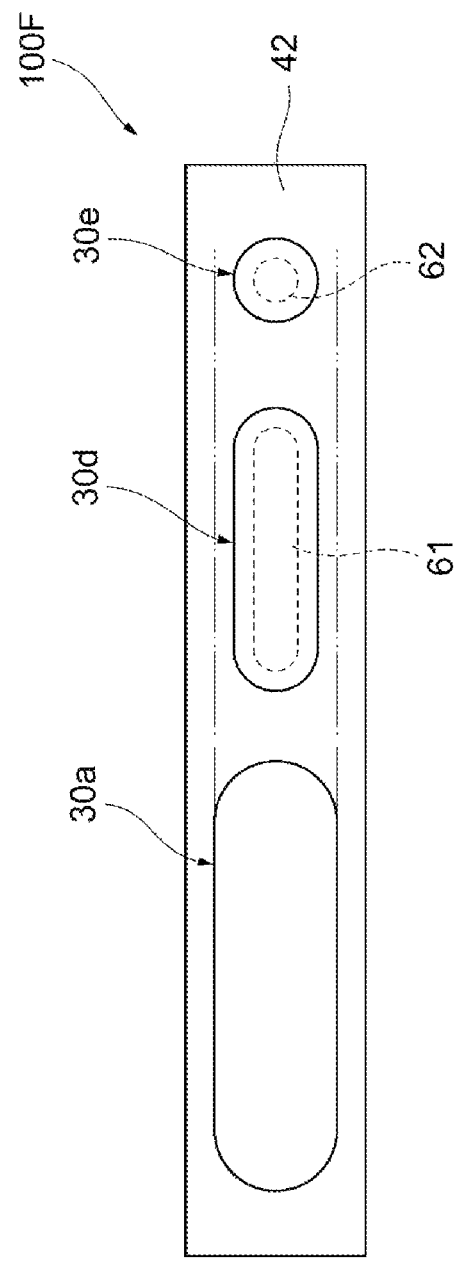
FIG. 8C is a plan view of a semiconductor chip according to a sixth embodiment of the disclosure.
Figure 8D:
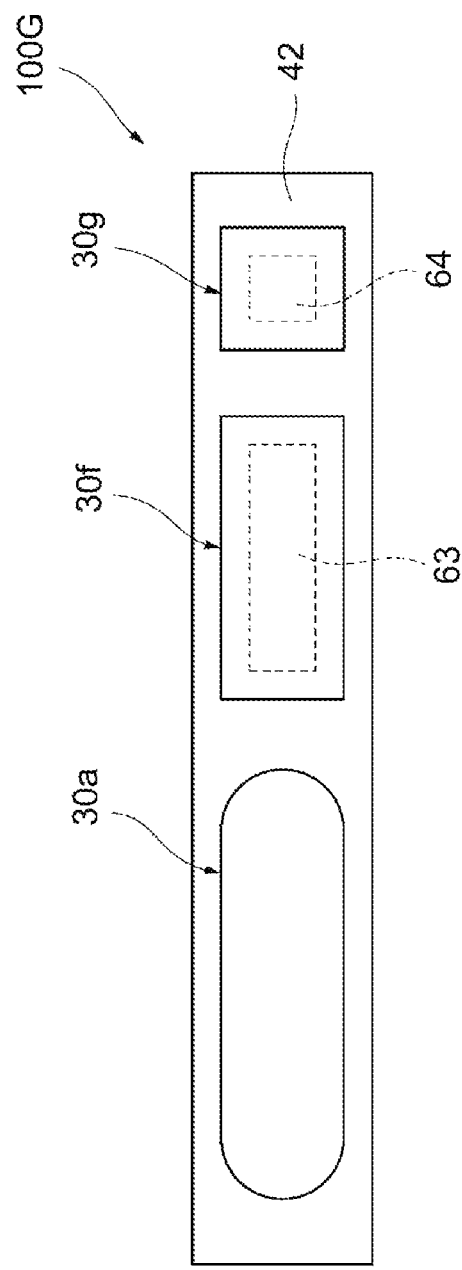
FIG. 8D is a plan view of a semiconductor chip according to a seventh embodiment of the disclosure.

Semiconductor chips 100D through 100G according to fourth through seventh embodiments will be described below with reference to FIGS. 8A through 8D. FIG. 8A is a plan view of the semiconductor chip 100D according to the fourth embodiment. FIG. 8B is a plan view of the semiconductor chip 100E according to the fifth embodiment. FIG. 8C is a plan view of the semiconductor chip 100F according to the sixth embodiment. FIG. 8D is a plan view of the semiconductor chip 100G according to the seventh embodiment. The sectional structures of the semiconductor chips 100D through 100G are similar to those shown in FIGS. 2 and 6, and are not shown.

As shown in FIGS. 8A through 8D, the planar configurations of Cu pillar bumps and insulating layers placed under the Cu pillar bumps are not restricted to particular configurations. For example, in the semiconductor chip 100D, six insulating layers 57 are arranged under the Cu pillar bump 30b, and four insulating layers 58 are arranged under the Cu pillar bump 30c. In the semiconductor chips 100E and 100F, the planar configuration of insulating layers 59 and 61 is a substantially ellipse and that of the insulating layers 60 and 62 is a substantially circle, instead of a rectangle. In the semiconductor chip 100F, the widths of the minor axes of Cu pillar bumps 30d and 30e are shorter than the width of the Cu pillar bump 30a. In the semiconductor chip 100G, the planar configuration of a Cu pillar bump 30f is a substantially rectangle instead of an ellipse, and that of a Cu pillar bump 30g is a substantially square instead of a circle.

With the configurations of the semiconductor chips 100D through 100G, as well as the configuration of the semiconductor chip 100A, the heights of the Cu pillar bumps can be made substantially uniform without depending on the control of the amount of solder to be applied to the bumps. The planar configurations of the Cu pillar bumps and the insulating layers shown in FIGS. 8A through 8D are only examples and are not restricted to the examples.

A manufacturing method for the semiconductor chip 100A of the first embodiment will be described below with reference to FIGS. 9A through 9J. FIGS. 9A through 9J illustrate steps of a manufacturing method for the semiconductor chip 100A of the first embodiment. FIGS. 9A through 9J are sectional views of the semiconductor chip 100A cut along a direction similar to that of FIG. 2. In the following description, it is assumed that plural transistors are formed in the circuit forming region 20 as an example of an electrical circuit. For the sake of description, the same elements as those of the first embodiment shown in FIG. 2 are designated by like reference numerals, and an explanation thereof will thus be omitted.

Figure 9A:
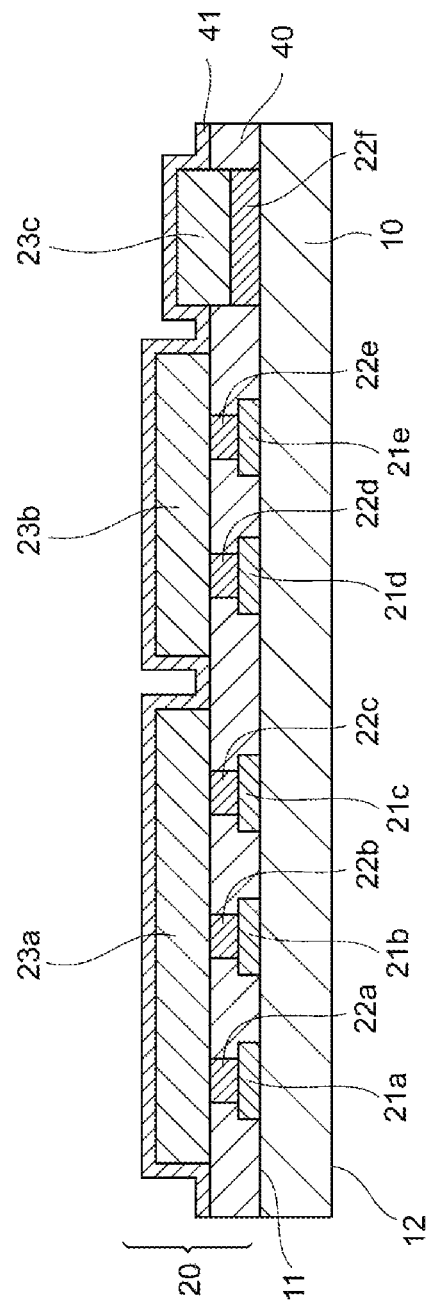
FIGS. 9A through 9J illustrate steps of a manufacturing method for the semiconductor chip of the first embodiment.

First, as shown in FIG. 9A, by using a typical semiconductor process, plural transistors 21a through 21e, plural electrodes 22a through 22f and 23a through 23c, and insulating layers 40 and 41 are formed in the circuit forming region 20 on the semiconductor substrate 10.

Figure 9B:
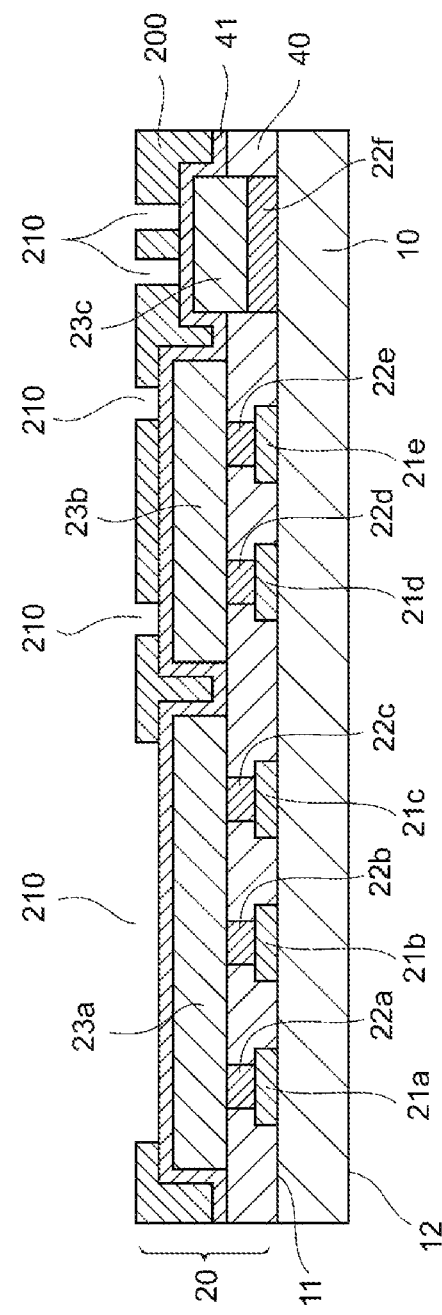

Then, as shown in FIG. 9B, a resist 200 having plural cavities 210 is formed on the insulating layer 41. The resist 200 serves as a mask for forming the plural cavities 43a through 43c in the insulating layer 41.

Figure 9C:
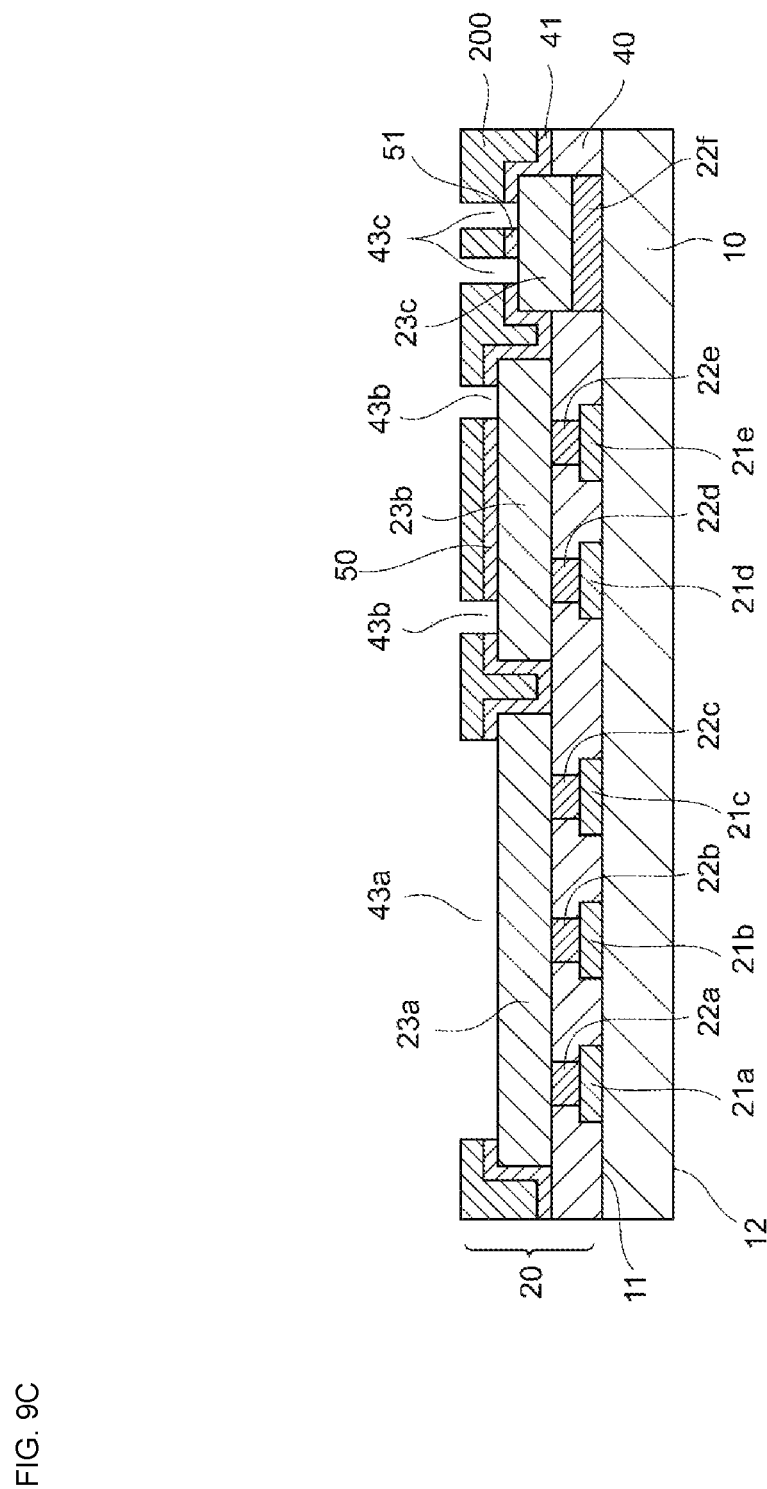

Then, as shown in FIG. 9C, by using the resist 200 as a mask, cavities 43a through 43c are formed in the insulating layer 41 under the plural cavities 210 by dry etching. As a result, insulating layers 50 and 51 are separated from the insulating layer 41. By forming the cavities 43a through 43c, the Cu pillar bumps 30a through 30c and the electrodes 23a through 23c can be electrically connected to each other even with the presence of the insulating layers 50 and 51 formed on the electrodes 23b and 23c, respectively.

Figure 9D:
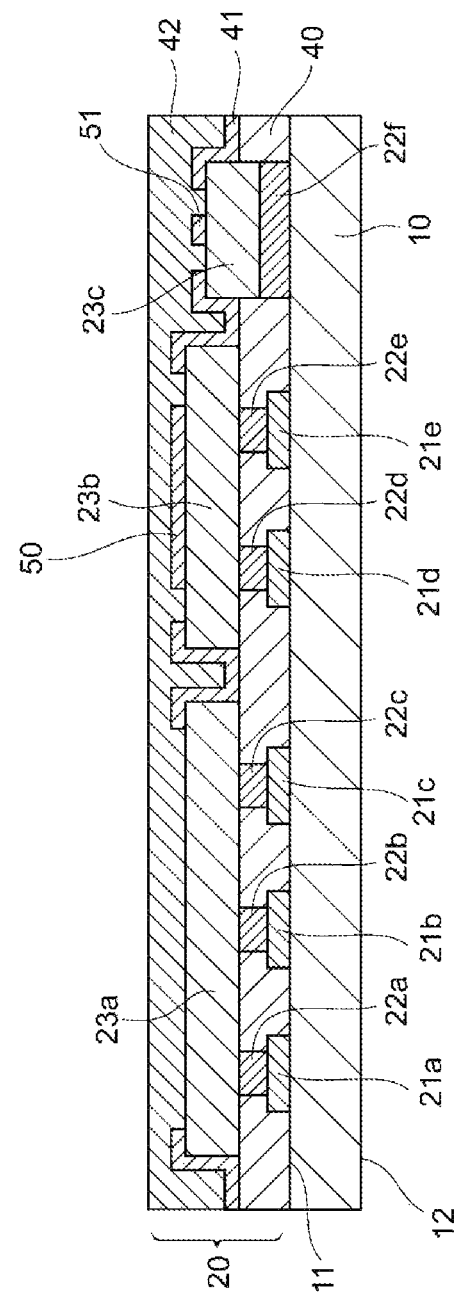

Then, as shown in FIG. 9D, the resist 200 is removed, and the insulating layer 42 is applied to the entire surfaces of the electrodes 23a through 23c and the insulating layer 41.

Figure 9E:
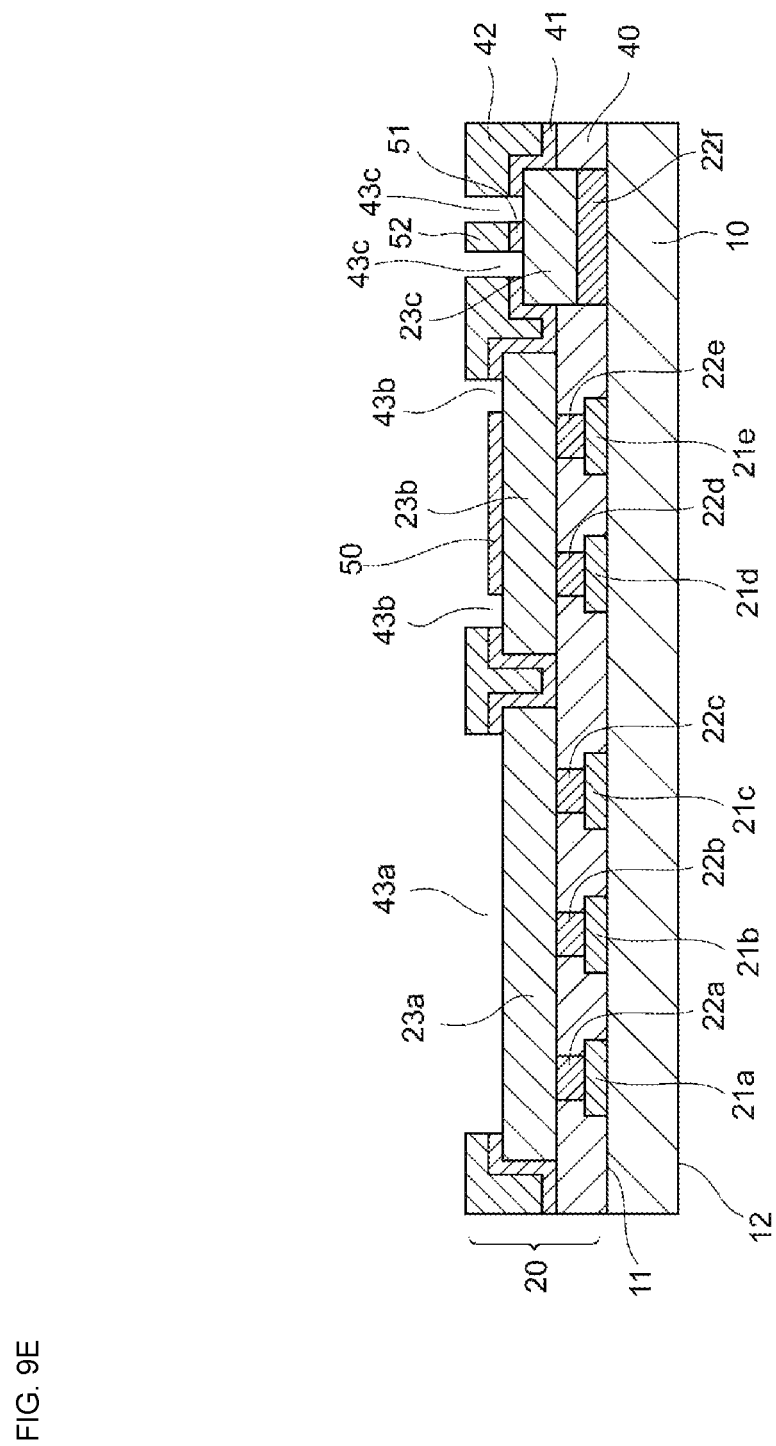

Then, as shown in FIG. 9E, the cavities 43a through 43c are formed in the insulating layer 42. To form the cavities 43a through 43c, for example, a photosensitive resin is used as the insulating layer 42, and the insulating layer 42 is exposed and developed by using a photolithographic process. More specifically, the insulating layer 42 on the electrode 23a and on the insulating layer 50 is removed, while the insulating layer 42 on the insulating layer 51 is left and used as the insulating layer 52 shown in FIG. 2. As a result of this process, no insulating layer is placed under the Cu pillar bump 30a, a single layer constituted by the insulating layer 50 is placed under the Cu pillar bump 30b, and double layers constituted by the insulating layers 51 and 52 are placed under the Cu pillar bump 30c.

Figure 9F:
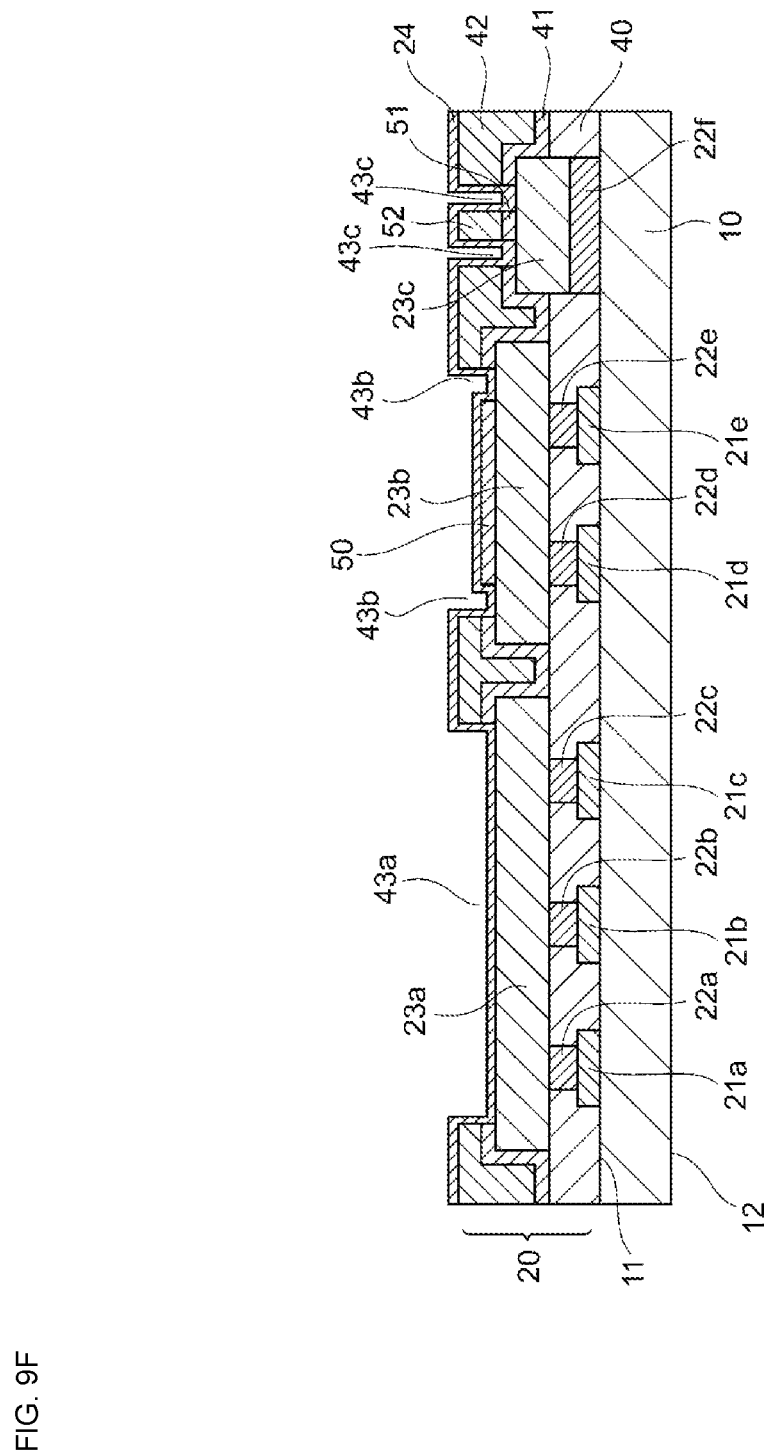

Then, as shown in FIG. 9F, a plating seed layer 24 is formed on the top surfaces of the electrodes 23a through 23c, the top surfaces of the insulating layers 42, 50, and 52, and the entire inner wall surfaces of the cavities 43a through 43c. The plating seed layer 24 is constituted by a TiW layer having a thickness of about 0.3 µm and a Cu layer having a thickness of about 0.3 µm stacked on each other. Instead of TiW, Ti, W, Ta, TiN, TaN, or WN may be used.

Figure 9G:
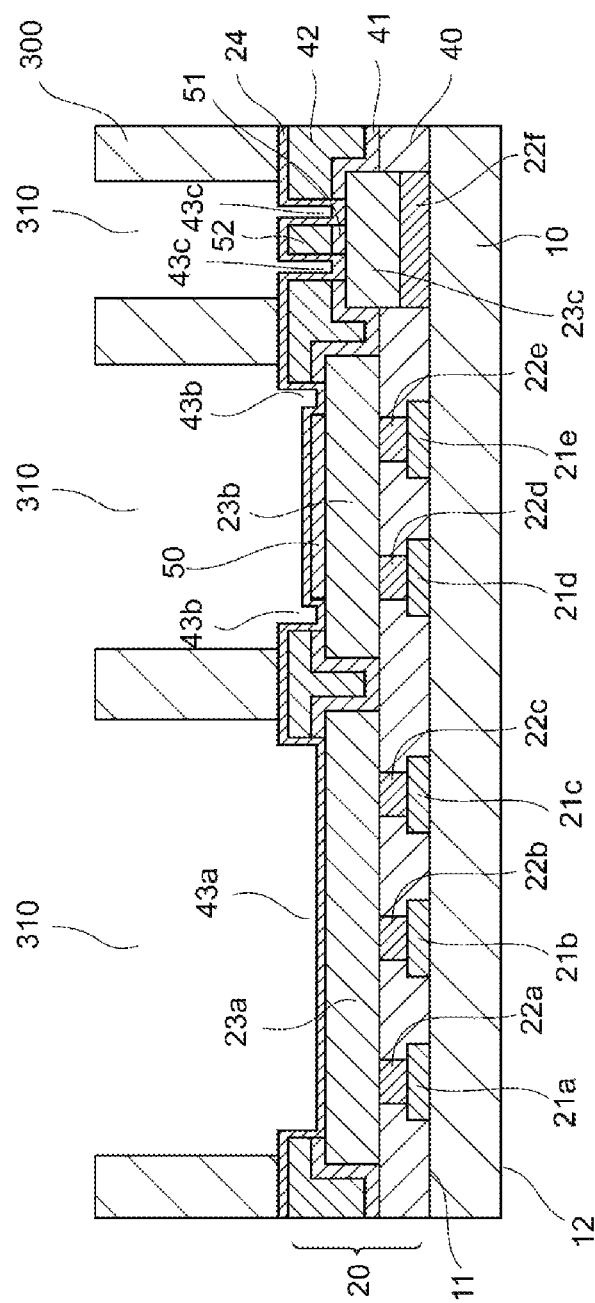

Then, as shown in FIG. 9G, a resist 300 for forming the Cu pillar bumps 30a through 30c is formed. The resist 300 has cavities 310 in regions where the Cu pillar bumps 30a through 30c will be formed.

Figure 9H:
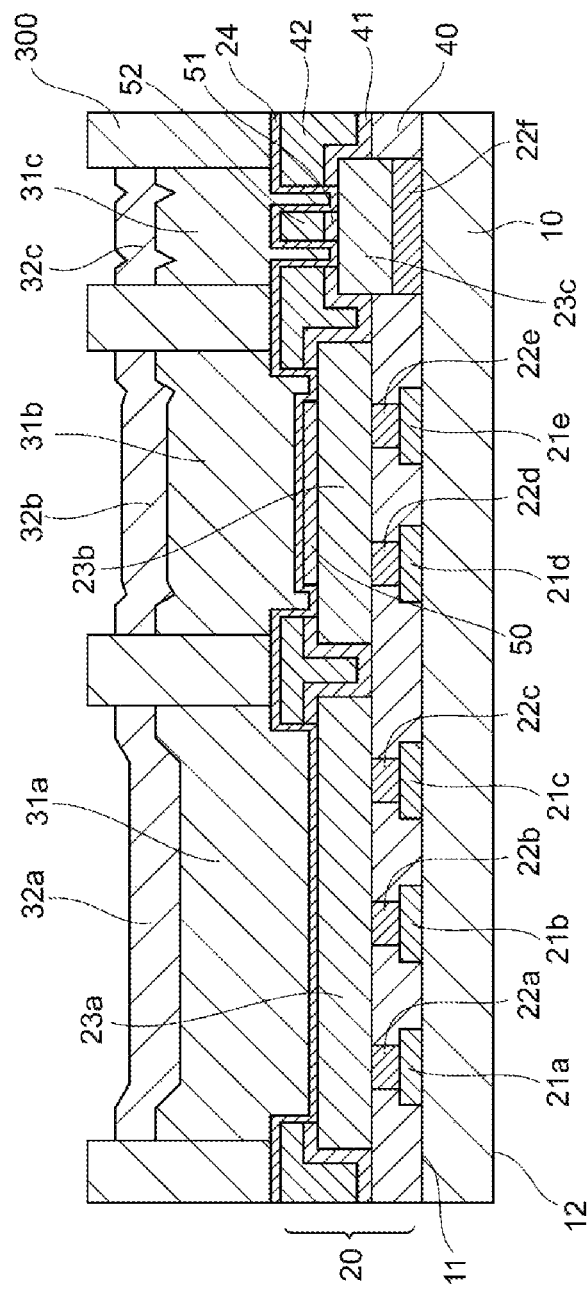

Then, as shown in FIG. 9H, Cu layers 31a through 31c and solder layers 32a through 32c are sequentially formed by plating. Because of the differences in the height of the plating seed layer 24, which serves as a base for the Cu layers 31a through 31c, very small projections and depressions may be formed on the top surfaces of the Cu layers 31a through 31c and the solder layers 32a through 32c.

Figure 9I:
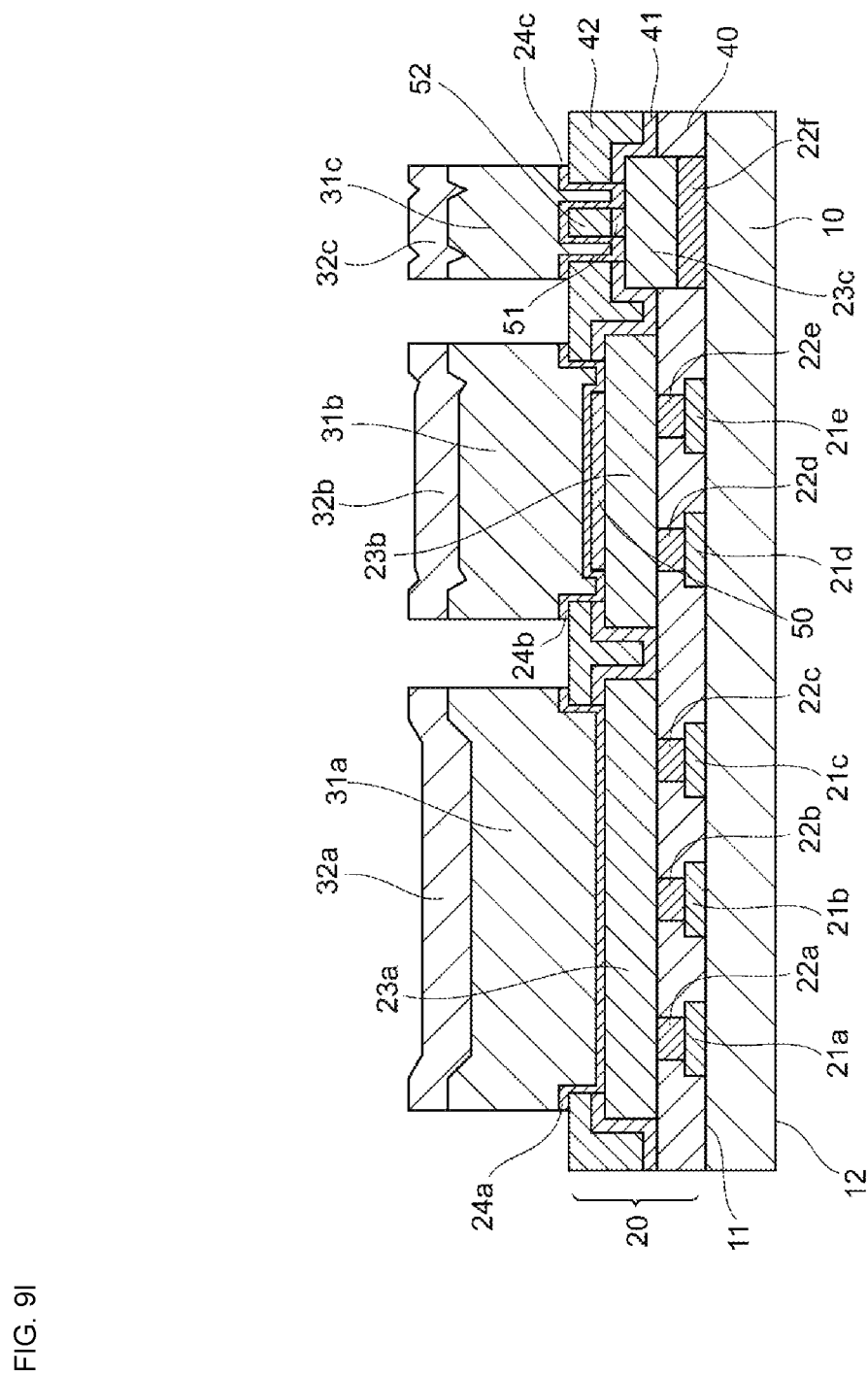

Then, as shown in FIG. 9I, the resist 300 and part of the plating seed layer 24 are removed, thereby dividing the plating seed layer 24 into plating seed layers 24a through 24c.

Figure 9J:
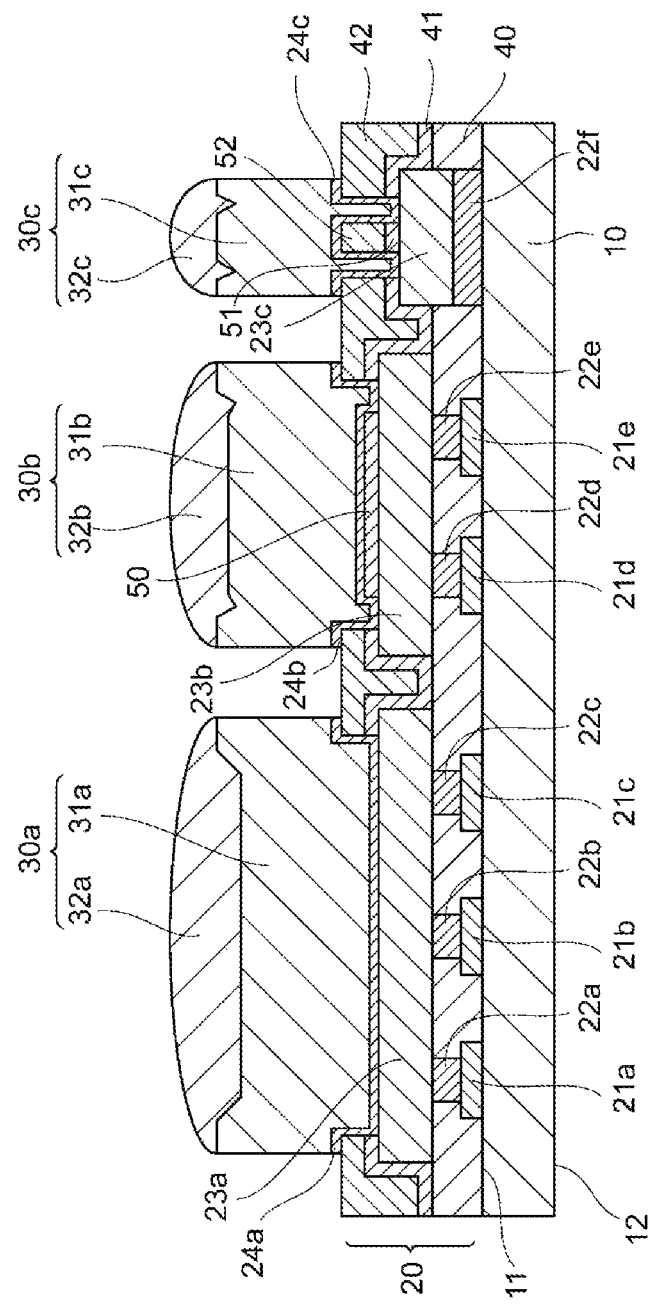

Finally, as shown in FIG. 9J, the solder layers 32a through 32c are melted by reflow soldering. In the Cu pillar bumps 30a through 30c after conducting reflow soldering, the thickness of the Cu layers 31a through 31c is about 40 µm, and the thickness of the solder layers 32a through 32c is about 30 µm.

According to the above-described manufacturing method, the semiconductor chip 100A including the Cu pillar bumps 30a through 30c with the heights adjusted can be manufactured. The manufacturing method for the semiconductor chip 100A is not restricted to this example. The semiconductor chips 100B through 100G of the second through seventh embodiments may be manufactured similarly according to the above-described manufacturing method.

In the above-described embodiments, the height of a Cu pillar bump is adjusted by inserting an insulating layer. However, the layer for adjusting the height of a Cu pillar bump is not restricted to the insulating layer, and may be a layer made of another material. An embodiment will be discussed below in which the height of a Cu pillar bump is adjusted by inserting a semiconductor layer instead of an insulating layer.

Figure 10:
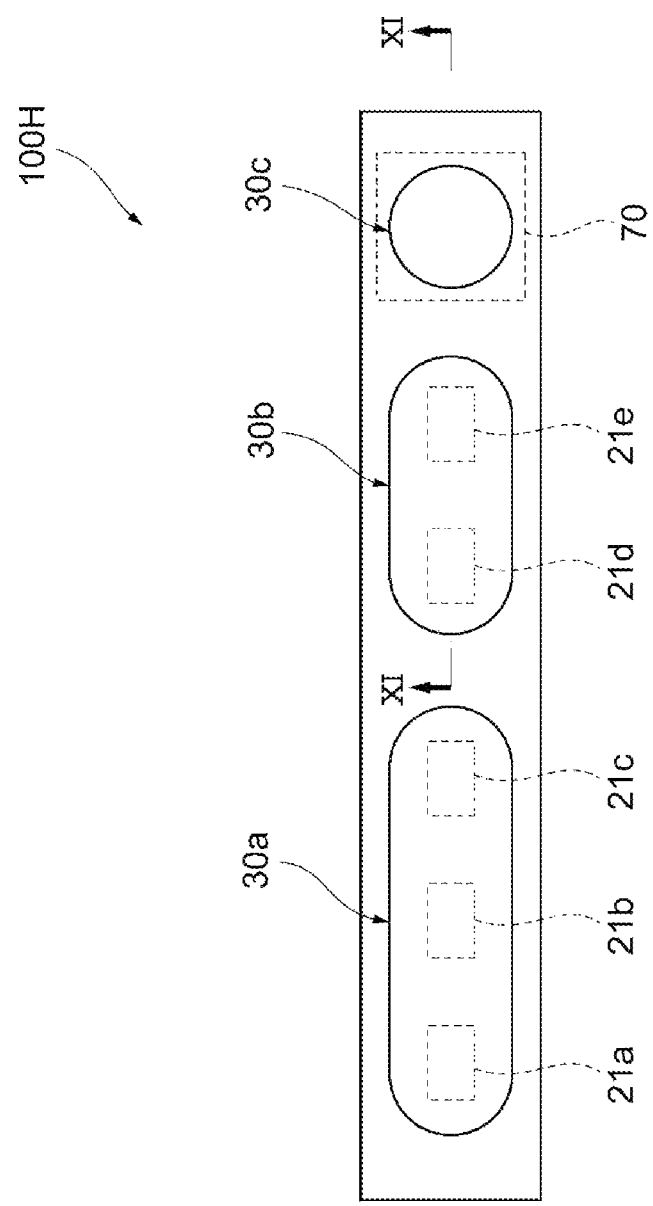
FIG. 10 is a plan view of a semiconductor chip according to an eighth embodiment of the disclosure.
Figure 11:
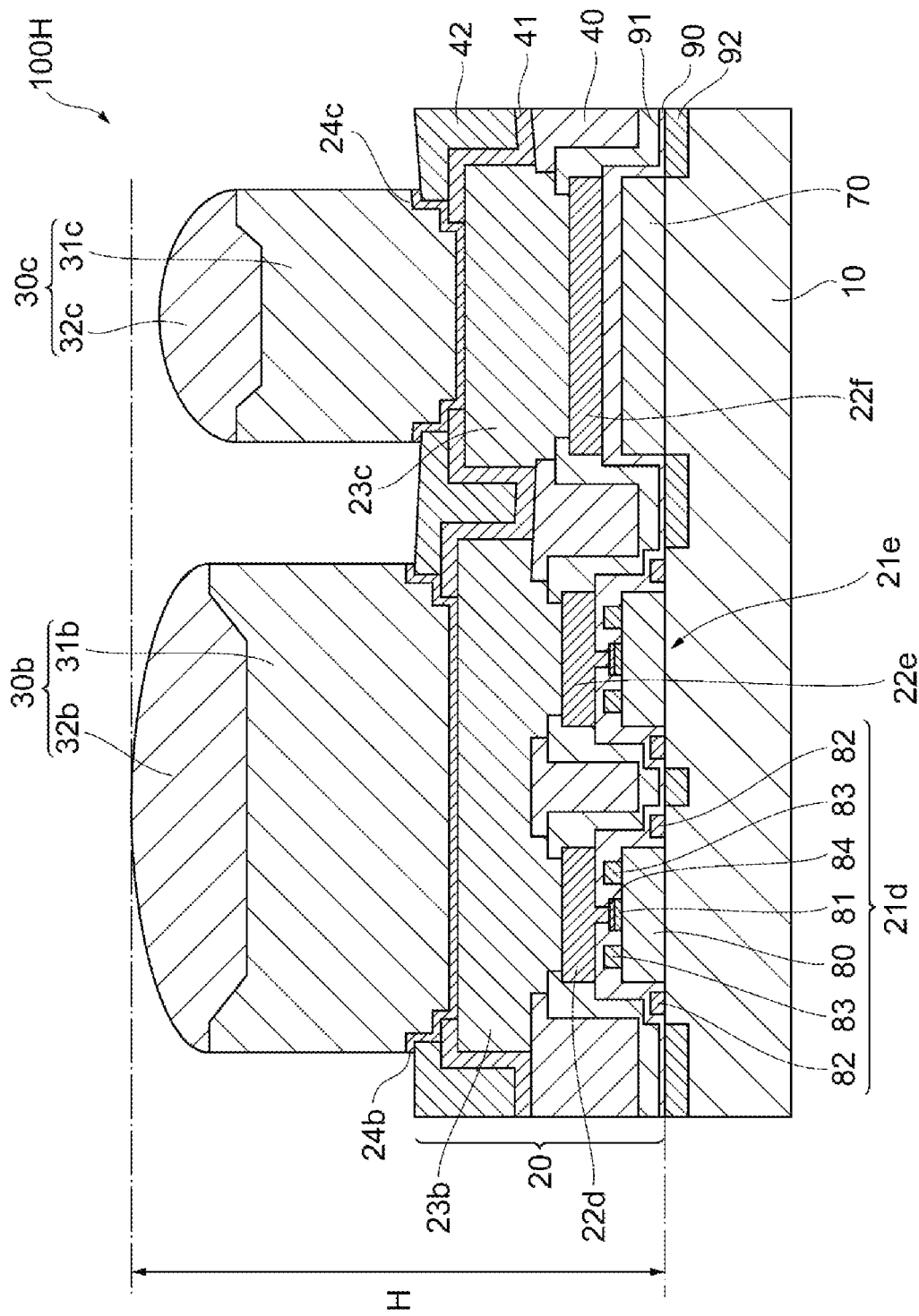
FIG. 11 is a sectional view taken along line XI-XI of FIG. 10.

A semiconductor chip 100H according to an eighth embodiment will be described below with reference to FIGS. 10 and 11. FIG. 10 is a plan view of the semiconductor chip 100H according to the eighth embodiment. FIG. 11 is a sectional view taken along line XI-XI of FIG. 10.

In the semiconductor chip 100H in FIG. 10, transistors 21a, 21b, and 21c are disposed under the Cu pillar bump 30a, while transistors 21d and 21e are disposed under the Cu pillar bump 30b. No transistors are disposed under the Cu pillar bump 30c, and instead, a semiconductor layer 70 is inserted to adjust the height of the Cu pillar bump 30c. The semiconductor layer 70 is formed in the shape of a substantially square, for example, in a plan view of the main surface of the semiconductor substrate. The area of the semiconductor layer 70 is larger than that of the Cu pillar bump 30c and is placed in the entire region under the Cu pillar bump 30c.

FIG. 11 illustrates details of the transistors 21d and 21e and surrounding elements corresponding to those of the semiconductor chip 100A shown in FIG. 2. The structure of the Cu pillar bump 30a is similar to that of the Cu pillar bump 30b and is not shown in FIG. 11. Illustration of the Cu pillar bump 30a is also omitted in the sectional views of FIGS. 12, 15, 16, and 17. For the sake of description, elements having functions similar to those in FIG. 2 are designated by like reference numerals in FIG. 11 and an explanation thereof will be omitted, even though the configurations and sizes thereof are slightly different from those in FIG. 2.

The transistors 21d and 21e are formed under the Cu pillar bump 30b (second bump). The transistor 21d includes a base layer 80, an emitter layer 81, a pair of collector electrodes 82, a pair of base electrodes 83, and an emitter electrode 84. The structure of the transistor 21e is similar to that of the transistor 21d, and an explanation thereof will thus be omitted.

The base layer 80 (second semiconductor layer) and the emitter layer 81 are sequentially stacked on the main surface of the semiconductor substrate 10. The base layer 80 and the emitter layer 81 are formed in the shape of a mesa elevated in a direction normal to the main surface of the semiconductor substrate 10. The lateral surfaces of the mesa structure of the base layer 80 and the emitter layer 81 may be perpendicular to the main surface, or may extend in the forward direction (flare out from the top to the bottom) or in the reverse direction (flare out from the bottom to the top) with respect to the main surface. The semiconductor layer 70, which will be discussed later, may be formed in a similar manner.

The pair of collector electrodes 82 are formed on the main surface of the semiconductor substrate 10 and sandwich the base layer 80 therebetween. The pair of collector electrodes 82 are electrically connected to a collector layer (not shown) formed under the base layer 80. The pair of base electrodes 83 are formed on the base layer 80 and sandwich the emitter layer 81 therebetween. The emitter electrode 84 is formed on the emitter layer 81, and is electrically connected to the above-described electrode 22d. With this configuration, the Cu pillar bump 30b serves as an emitter electrode for electrically connecting the emitter of the transistor 21d to the outside the semiconductor chip 100H.

Instead of a transistor, the semiconductor layer 70 (first semiconductor layer) is formed under the Cu pillar bump 30c (first bump). The semiconductor layer 70 is formed on the main surface of the semiconductor substrate 10. The semiconductor layer 70 is formed during the process of forming the base layer 80 of the transistor 21d, for example. The semiconductor layer 70 is formed in the shape of a mesa elevated in a direction normal to the main surface of the semiconductor substrate 10. The material for the semiconductor layer 70 is the same as the base layer 80, and contains GaAs, for example, as the principal component. The material for the semiconductor layer 70 is not restricted to GaAs, and may be Si, InP, SiC, or GaN in accordance with the material for the base layer 80. Placing of the semiconductor layer 70 under the Cu pillar bump 30c can increase the height of the Cu pillar bump 30c by the thickness of the semiconductor layer 70.

An insulating layer 90 (fourth insulating layer), which serves as a protective film, is disposed above the transistors 21d and 21e and above the semiconductor layer 70. The insulating layer 90 has cavities above the transistors 21d and 21e to provide electrical connection between the emitter electrode 84 and the electrode 22d, that is, between the emitter electrode 84 and the Cu pillar bump 30b. In contrast, the insulating layer 90 does not have any cavity above the semiconductor layer 70 because electrical connection between the semiconductor layer 70 and the Cu pillar bump 30c is not required. No electrical connection is provided between the Cu pillar bump 30c and the semiconductor layer 70, and they are insulated from each other by the insulating layer 90.

Plural electrodes 22d through 22f and an insulating layer 91, which serves as a protective film, are stacked on the insulating layer 90. The insulating layer 91 has plural cavities to provide electrical connection between the electrodes 22d and 22e and the electrode 23b formed above the electrodes 22d and 22e and between the electrode 22f and the electrode 23c formed above the electrode 22f. The material for the insulating layers 90 and 91 is not restricted to a particular material, and contains SiN, for example, as the principal component.

Plural isolation layers 92 are formed on the semiconductor substrate 10 to provide electrical isolation between the transistors 21d and 21e and between the transistor 21e and the semiconductor layer 70. The plural isolation layers 92 are formed on the semiconductor substrate 10 in the regions where the transistors 21d and 21e and the semiconductor layer 70 are not formed. In the semiconductor chip 100H, by inserting and placing the semiconductor layer 70 under the smaller Cu pillar bump 30c, the heights of the Cu pillar bumps 30b and 30c having different areas can be made substantially uniform.

Figure 12:
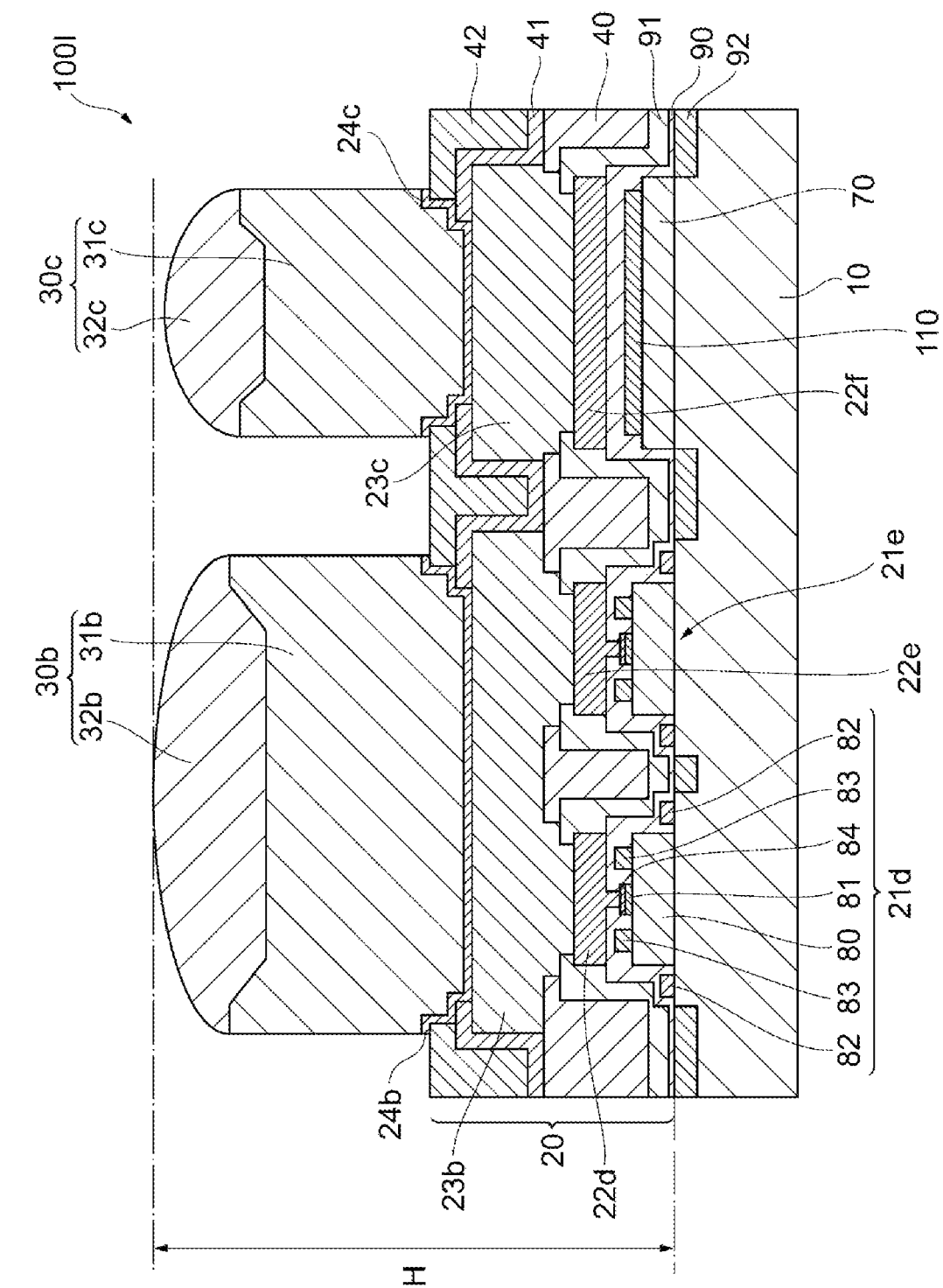
FIG. 12 is a sectional view of a semiconductor chip according to a ninth embodiment of the disclosure.

FIG. 12 is a sectional view of a semiconductor chip 100I according to a ninth embodiment cut along a direction similar to that in FIG. 11. The semiconductor chip 100I is different from the semiconductor chip 100H in that a metal layer 110 is also placed under the Cu pillar bump 30c.

The metal layer 110 (third metal layer) is formed above the semiconductor layer 70 and under the insulating layer 90. The metal layer 110 is formed during the process of forming the base electrodes 83 of the transistors 21d and 21e, for example. The material for the metal layer 110 is the same as the base electrodes 83, for example. Placing of the metal layer 110 under the Cu pillar bump 30c can further increase the height of the Cu pillar bump 30c by the thickness of the metal layer 110. In the semiconductor chip 100I, the height of the Cu pillar bump 30c is even closer to the height H of the Cu pillar bump 30b than that in the semiconductor chip 100H.

Figure 13:
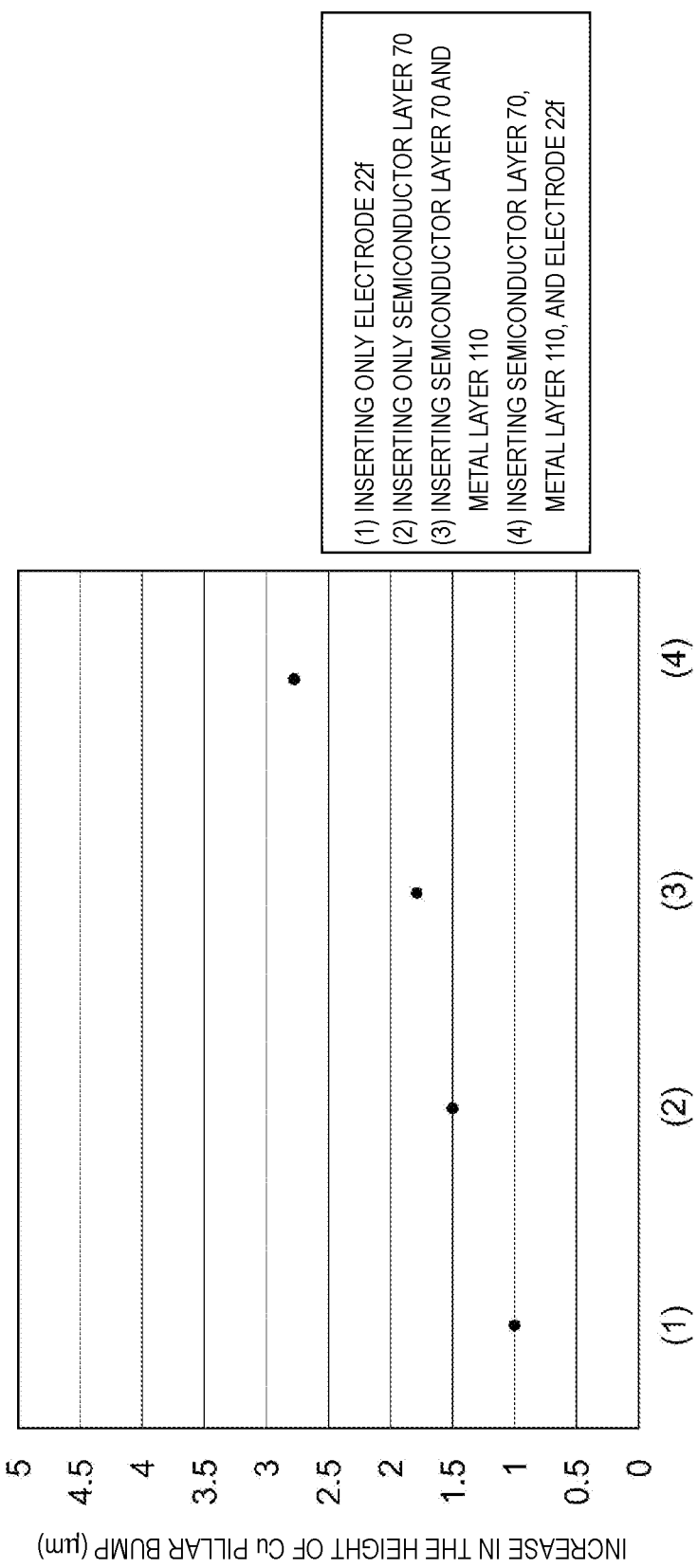
FIG. 13 is a graph illustrating simulation results of an increase in the height of a Cu pillar bump obtained by inserting a semiconductor layer and a metal layer.

FIG. 13 is a graph illustrating simulation results of an increase in the height of a Cu pillar bump obtained by inserting the semiconductor layer 70 and the metal layer 110. More specifically, FIG. 13 illustrates an increase in the height of the Cu pillar bump 30c shown in FIG. 11 or 12 by (1) inserting only the electrode 22f (comparative example), (2) inserting only the semiconductor layer 70, (3) inserting the semiconductor layer 70 and the metal layer 110, and (4) inserting the semiconductor layer 70, the metal layer 110, and the electrode 22f. In the graph in FIG. 13, the vertical axis indicates an increase (μm) in the height of the Cu pillar bump 30c.

In FIG. 13, (1) and (2) show that the height of the Cu pillar bump 30c is increased by about 0.5 μm by inserting the semiconductor layer 70 instead of the electrode 22f. In FIG. 13, (2) and (3) show that the height of the Cu pillar bump 30c is further increased by about 0.3 μm by inserting the metal layer 110. In FIG. 13, (4) shows that the height of the Cu pillar bump 30c is increased by about 2.8 μm by inserting the semiconductor layer 70, the metal layer 110, and the electrode 22f. In this manner, by changing the layers and electrodes to be inserted in accordance with the difference in the height between Cu pillar bumps, an increase in the height of a Cu pillar bump can suitably be adjusted.

FIGS. 14A through 14E are plan views of semiconductor chips 100J through 100N according to tenth through fourteenth embodiments. The sectional structures of the semiconductor chips 100J through 100N are similar to the sectional structure shown in FIG. 11 and are not shown.

In the semiconductor chips 100J through 100N, semiconductor layers 71 through 75 having a function similar to that of the semiconductor layer 70 are placed under the corresponding Cu pillar bumps 30c. As shown in FIGS. 14A through 14E, the planar configurations of the semiconductor layers 71 through 75 are not restricted to particular configurations. For example, in the semiconductor chip 100J in FIG. 14A, the semiconductor layer 71 is formed in the shape of a substantially square and is circumscribed about the Cu pillar bump 30c. In the semiconductor chip 100K in FIG. 14B, the semiconductor layer 72 is formed in the shape of a substantially square and is inscribed in the Cu pillar bump 30c. In the semiconductor chip 100L in FIG. 14C, the semiconductor layer 73 is formed in the shape of a substantially square and is smaller than the semiconductor layer 72 so as to be contained within the Cu pillar bump 30c. In the semiconductor chip 100M in FIG. 14D, the two semiconductor layers 74 formed in the shape of a substantially rectangle are disposed side by side under the Cu pillar bump 30c. In the semiconductor chip 100N in FIG. 14E, the four semiconductor layers 75 formed in the shape of a substantially square are disposed to surround the Cu pillar bump 30c. As is seen from FIGS. 14A through 14E, the semiconductor layers do not necessarily perfectly overlap the Cu pillar bumps 30c and may partially overlap the Cu pillar bumps 30c, as viewed from above.

In the semiconductor chips 100J through 100N configured as described above, as well as in the semiconductor chip 100H, the height of the Cu pillar bump 30c is close to the height H of the Cu pillar bump 30b. The planar configurations of the semiconductor layers 71 through 75 shown in FIGS. 14A through 14E and the number of semiconductor layers in each of the semiconductor chips 100J through 100N are not restricted to the above-described examples. In addition to or instead of the semiconductor layers 71 through 75, a metal layer corresponding to the metal layer 110 shown in FIG. 12 or an electrode corresponding to the electrode 22f shown in FIG. 12 may be inserted.

Figure 14A:
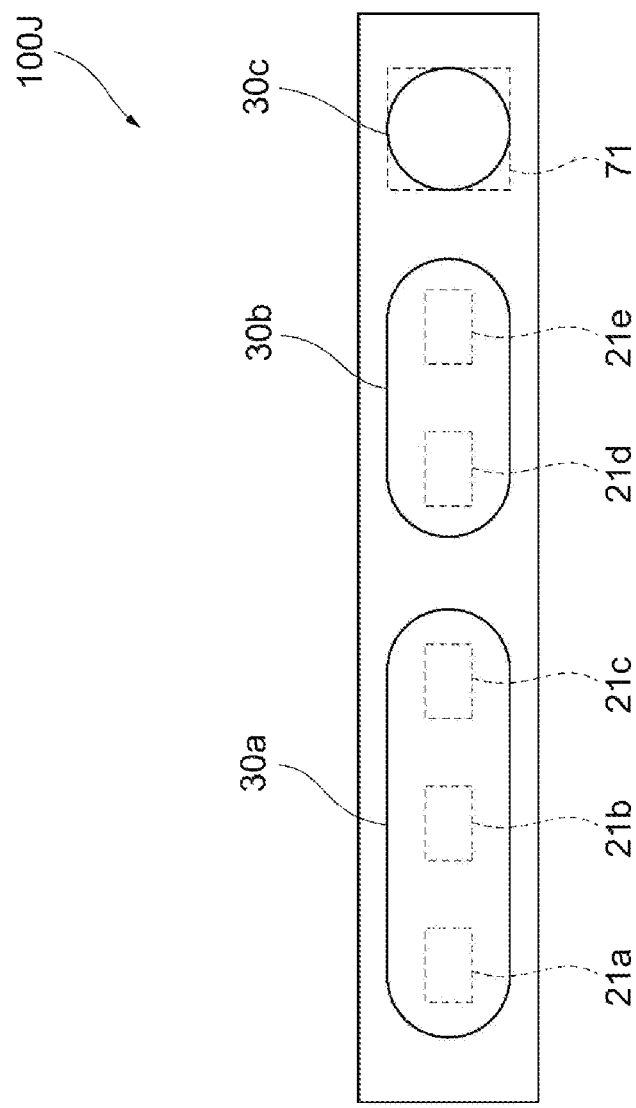
FIG. 14A is a plan view of a semiconductor chip according to a tenth embodiment of the disclosure.
Figure 14B:
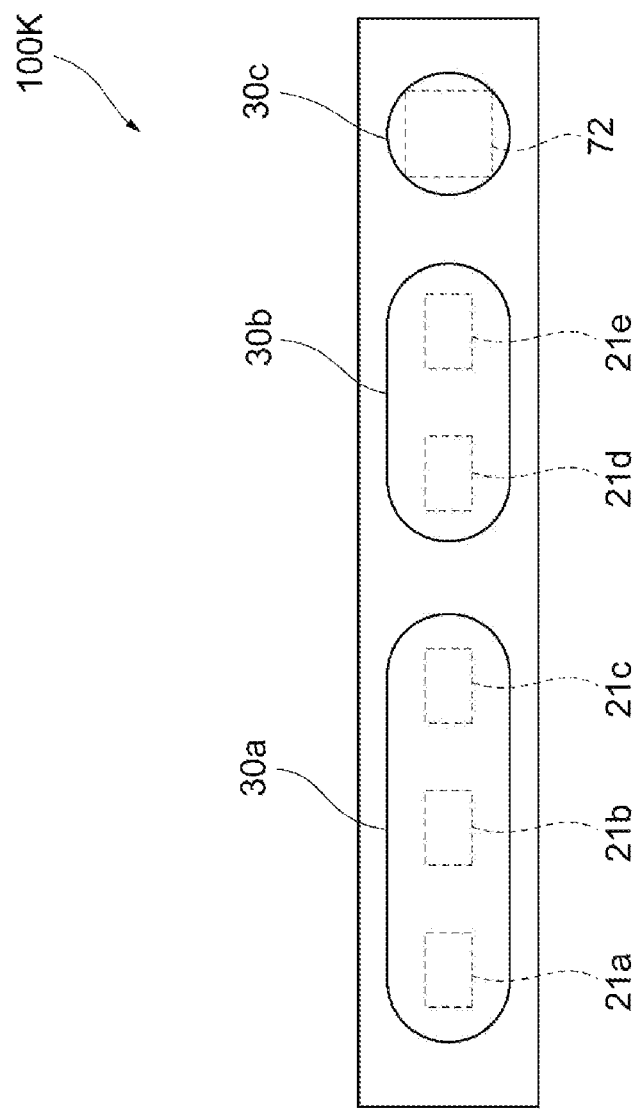
FIG. 14B is a plan view of a semiconductor chip according to an eleventh embodiment of the disclosure.
Figure 14C:
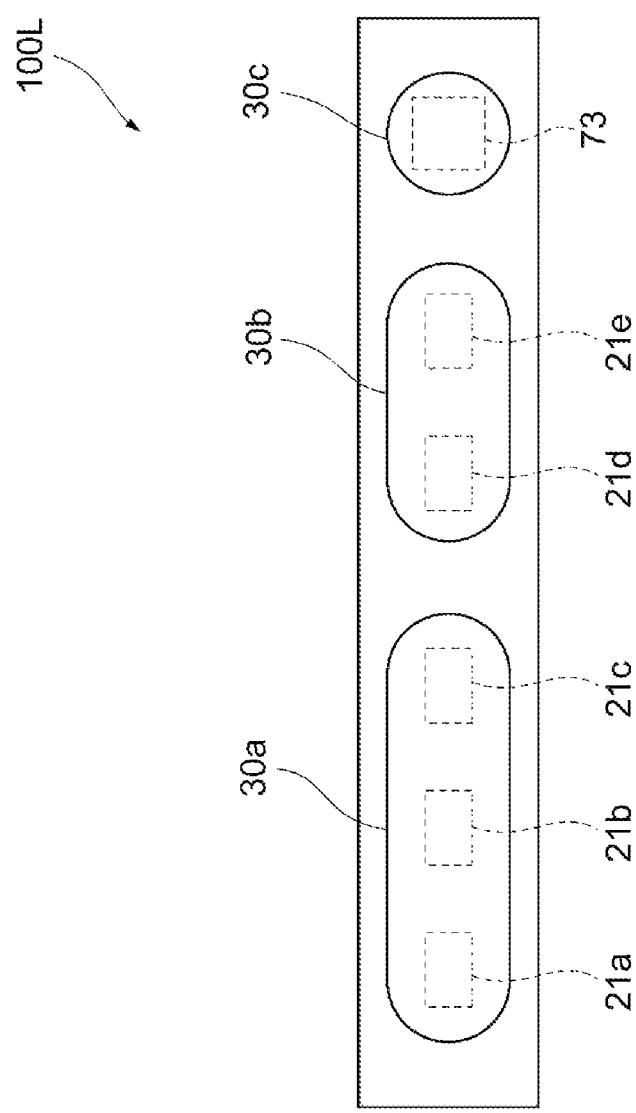
FIG. 14C is a plan view of a semiconductor chip according to a twelfth embodiment of the disclosure.
Figure 14D:
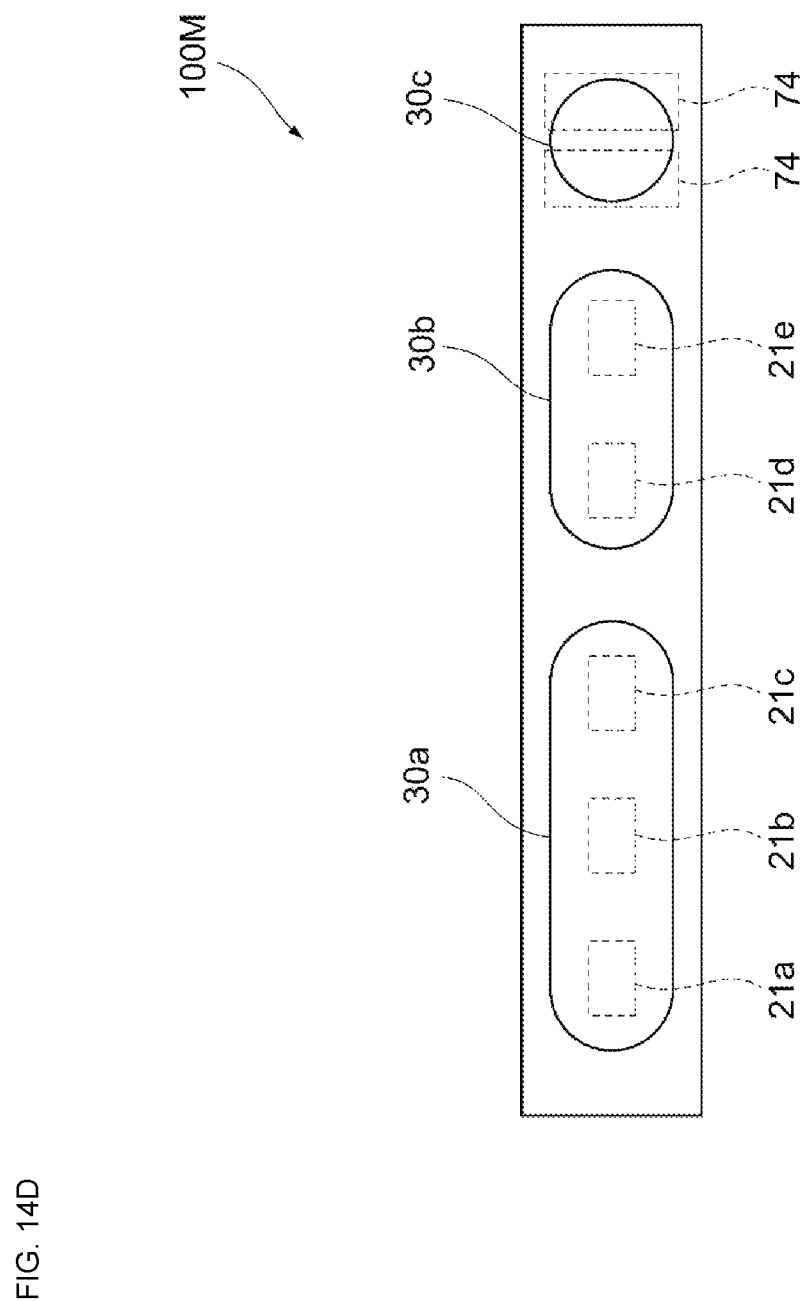
FIG. 14D is a plan view of a semiconductor chip according to a thirteenth embodiment of the disclosure.
Figure 14E:
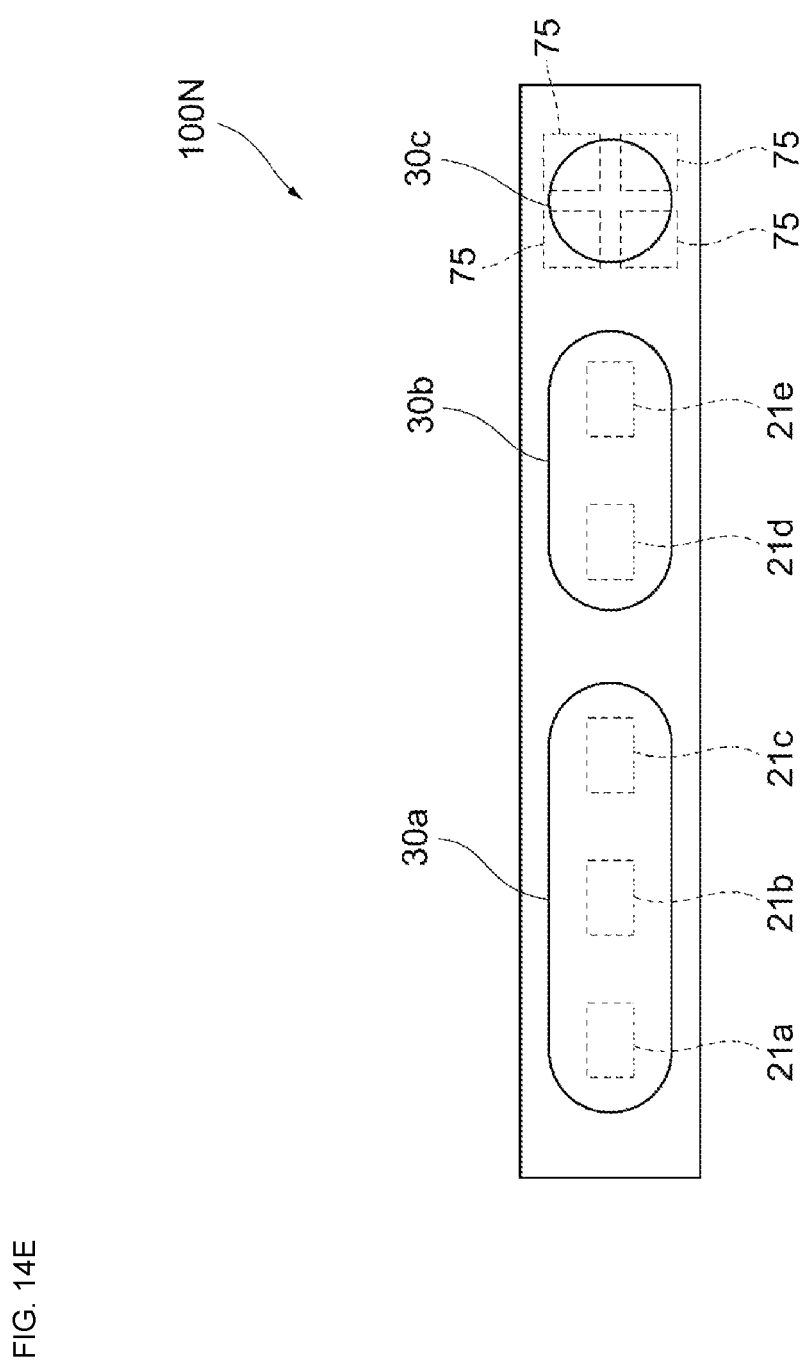
FIG. 14E is a plan view of a semiconductor chip according to a fourteenth embodiment of the disclosure.
Figure 14F:
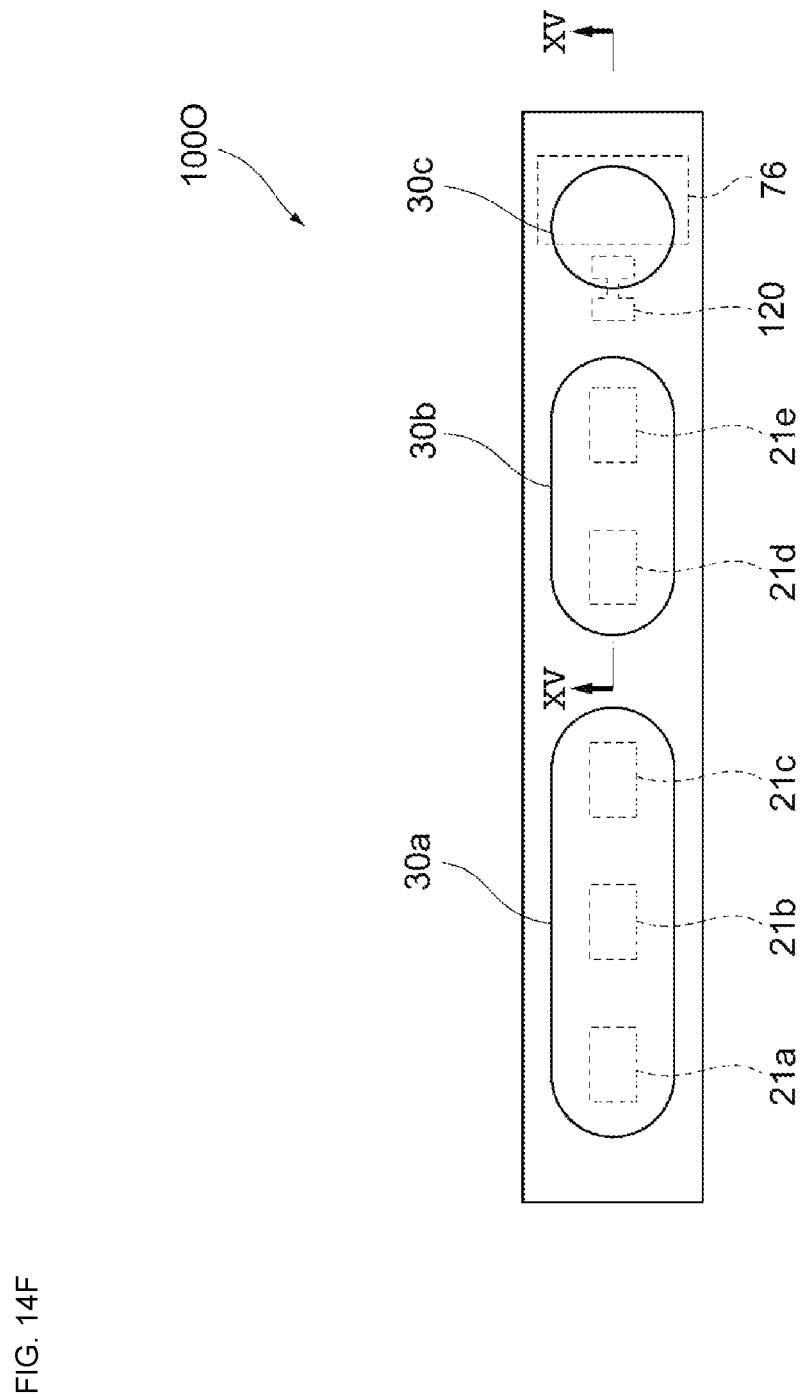
FIG. 14F is a plan view of a semiconductor chip according to a fifteenth embodiment of the disclosure.
Figure 15:
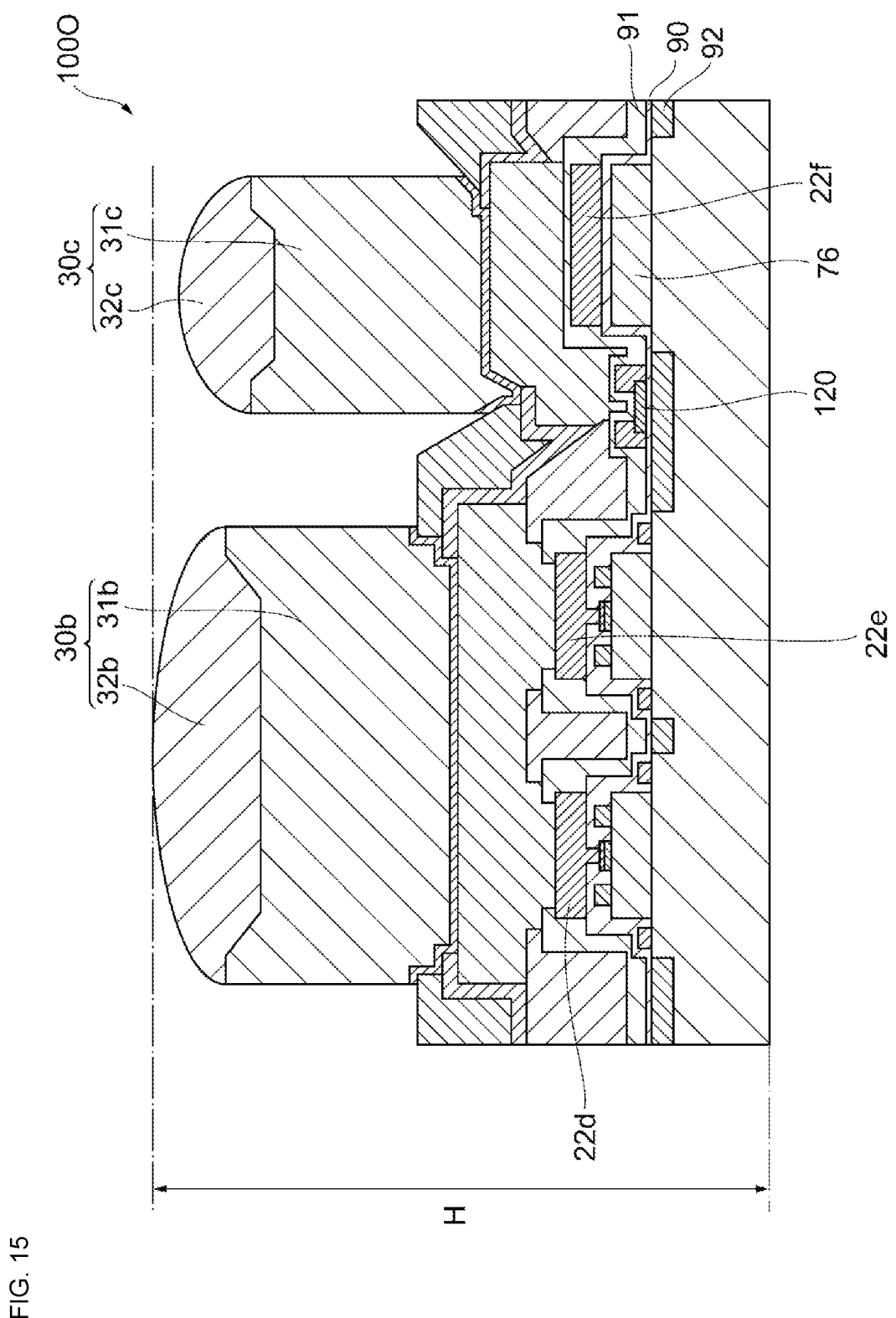
FIG. 15 is a sectional view taken along line XV-XV of FIG. 14F.

FIG. 14F is a plan view of a semiconductor chip 100O according to a fifteenth embodiment. FIG. 15 is a sectional view taken along line XV-XV of FIG. 14F. In the semiconductor chip 100O, an element is formed under the Cu pillar bump 30c.

More specifically, a thin film resistor (TFR) 120 is formed as an example of the element. As shown in FIG. 15, the TFR 120 is formed on the insulating layer 90 such that at least part of the TFR 120 is placed under the Cu pillar bump 30c. The TFR 120 is constituted by two electrodes and a thin film interposed between the two electrodes. The two electrodes of the TFR 120 may be formed during the process of forming the electrodes 22d through 22f.

A semiconductor layer 76 has a function similar to that of the above-described semiconductor layer 70, and is formed near the TFR 120 side by side so as to be at least partially placed under the Cu pillar bump 30c. An insulating layer 90 is formed on the semiconductor layer 76, the TFR 120 and the electrode 22f are formed on the insulating layer 90, and an insulating layer 91 is formed on the TFR 120 and the electrode 22f. As shown in FIG. 14F, the semiconductor layer 76 is formed in the shape of a substantially rectangle and overlaps about half of the Cu pillar bump 30c in a plan view of the main surface of the semiconductor substrate 10.

In the semiconductor chip 100O configured as described above, by inserting and placing the semiconductor layer 76 under the smaller Cu pillar bump 30c, the height of the Cu pillar bump 30c is increased to be closer to the height H of the Cu pillar bump 30b. The element formed under the Cu pillar bump 30c may be a passive element, such as a resistor element, as described above, or such as a diode.

In the example in FIG. 15, the semiconductor layer 76 and the electrode 22f are placed under the Cu pillar bump 30c. However, the semiconductor layer 76 may not be provided, and only the electrode 22f may be formed on the insulating layer 90. Alternatively, as in the semiconductor chip 100I shown in FIG. 12, a metal layer corresponding to the metal layer 110 may also be formed on the semiconductor layer 76.

Figure 16:
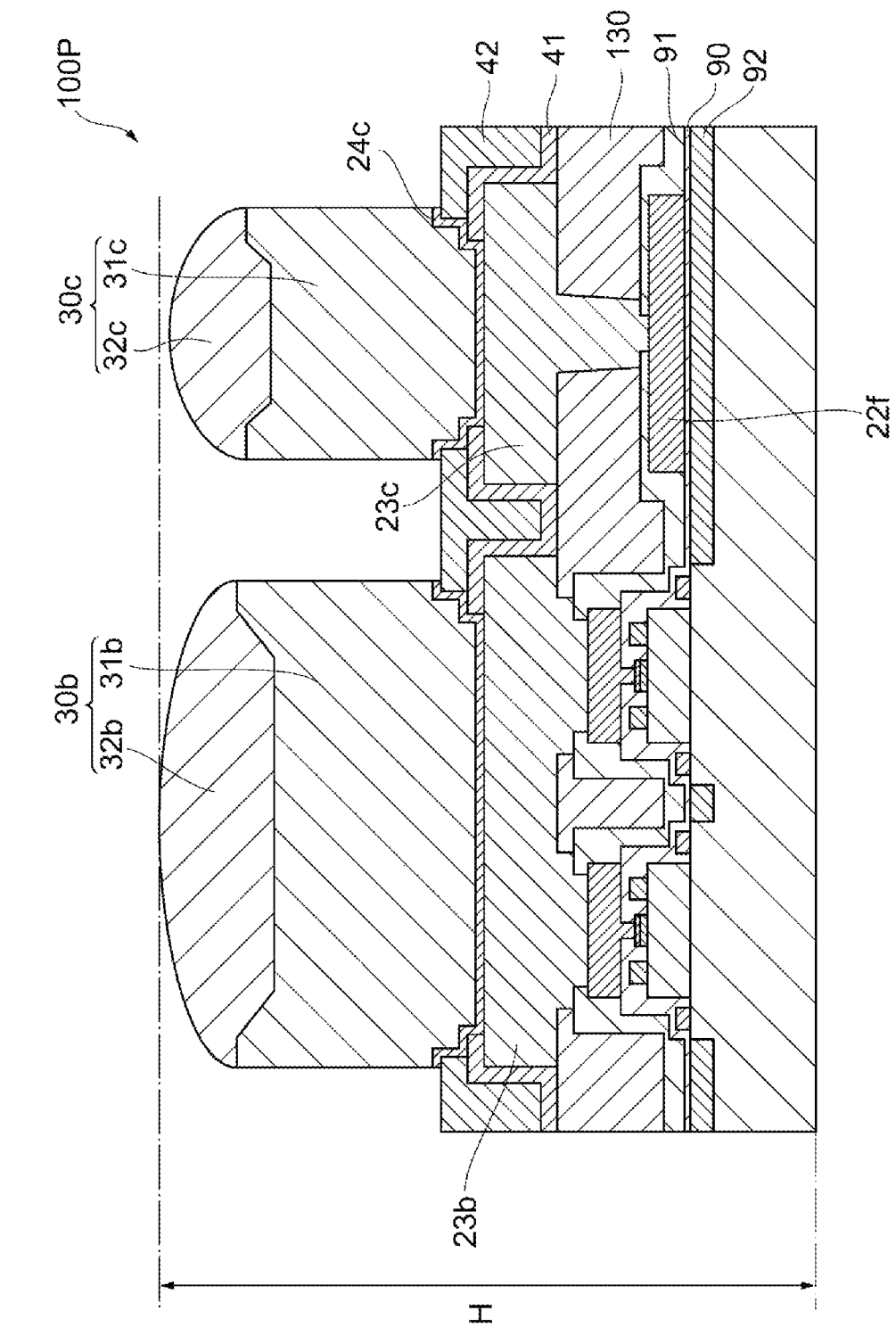
FIG. 16 is a sectional view of a semiconductor chip according to a sixteenth embodiment of the disclosure.

FIG. 16 is a sectional view of a semiconductor chip 100P according to a sixteenth embodiment cut along a direction similar to that in FIG. 11. The semiconductor chip 100P is different from the semiconductor chip 100H shown in FIG. 11 in that, instead of the semiconductor layer 70, an insulating layer 130 is provided and extends to reach the region under the Cu pillar bump 30c.

The insulating layer 130, which corresponds to the insulating layer 40 shown in FIG. 11, is filled into the regions around the plural transistors 21d and 21e and the plural electrodes 22d through 22f. For the insulating layer 130, a material similar to that for the insulating layer 40 may be used. The insulating layer 130 extends to reach the region under the Cu pillar bump 30c so as to adjust the height of the Cu pillar bump 30c.

In the semiconductor chip 100P, the insulating layers 130 and 91 have a cavity to provide electrical connection between the electrodes 23c and 22f, and the electrode 23c is filled into this cavity. With this configuration, the Cu pillar bump 30c and the electrode 22f are electrically connected to each other. In the sixteenth embodiment, the Cu pillar bump 30c serves as a bump for electrically connecting the electrode 22f to the outside the semiconductor chip 100P.

In the semiconductor chip 100P configured as described above, by changing the height of the insulating layer 130 or the region filled with the insulating layer 130, the height of the Cu pillar bump 30c can be adjusted. In addition to the provision of the insulating layer 130, a semiconductor layer corresponding to the semiconductor layer 70 in FIG. 12 or a metal layer corresponding to the metal layer 110 in FIG. 12 may also be inserted.

Figure 17:
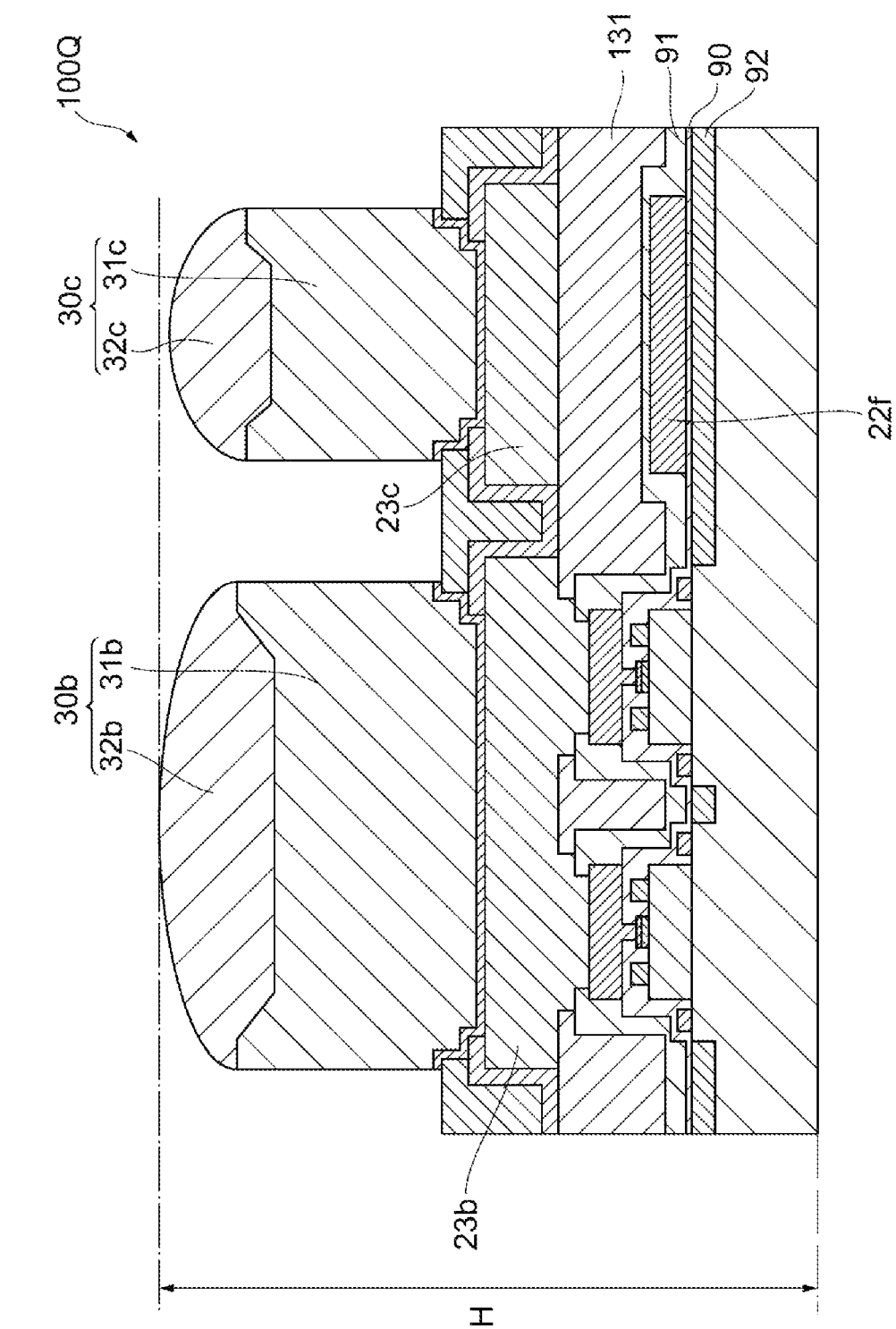
FIG. 17 is a sectional view of a semiconductor chip according to a seventeenth embodiment of the disclosure.

FIG. 17 is a sectional view of a semiconductor chip 100Q according to a seventeenth embodiment cut along a direction similar to that in FIG. 11. The semiconductor chip 100Q is different from the semiconductor chip 100P in FIG. 16 in that an insulating layer 131 filled into the region under the Cu pillar bump 30c does not have a cavity.

The insulating layer 131 is filled into the region above the insulating layer 91 and under the electrode 23c. This can electrically insulate the electrodes 23c and 22f from each other. If it is not necessary to electrically connect the electrode 22f and the Cu pillar bump 30c, the insulating layer 131 may not necessarily have a cavity. In this case, the electrode 22f may serve as a metal layer which is not electrically connected to other devices.

A manufacturing method for the semiconductor chip 100I of the ninth embodiment will be described below with reference to FIGS. 18A through 18J. FIGS. 18A through 18J illustrate steps of a manufacturing method for the semiconductor chip 100I of the ninth embodiment. FIGS. 18A through 18J are sectional views of the semiconductor chip 100I cut along a direction similar to that of FIG. 12. For the sake of description, the same elements as those shown in FIG. 12 are designated by like reference numerals, and an explanation thereof will thus be omitted.

Figure 18A:
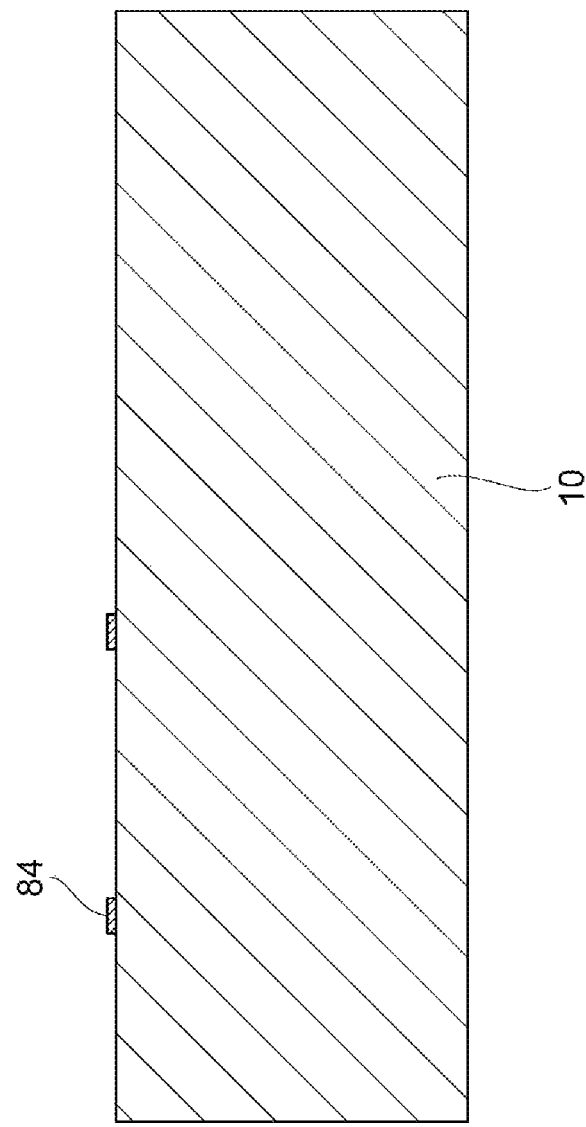
FIGS. 18A through 18J illustrate steps of a manufacturing method for the semiconductor chip of the ninth embodiment.

First, a resist, which serves as a mask, is applied onto the semiconductor substrate 10. A metal layer is formed by deposition or sputtering, for example, and then, the resist is removed. As a result, emitter electrodes 84 of transistors are formed as shown in FIG. 18A.

Figure 18B:
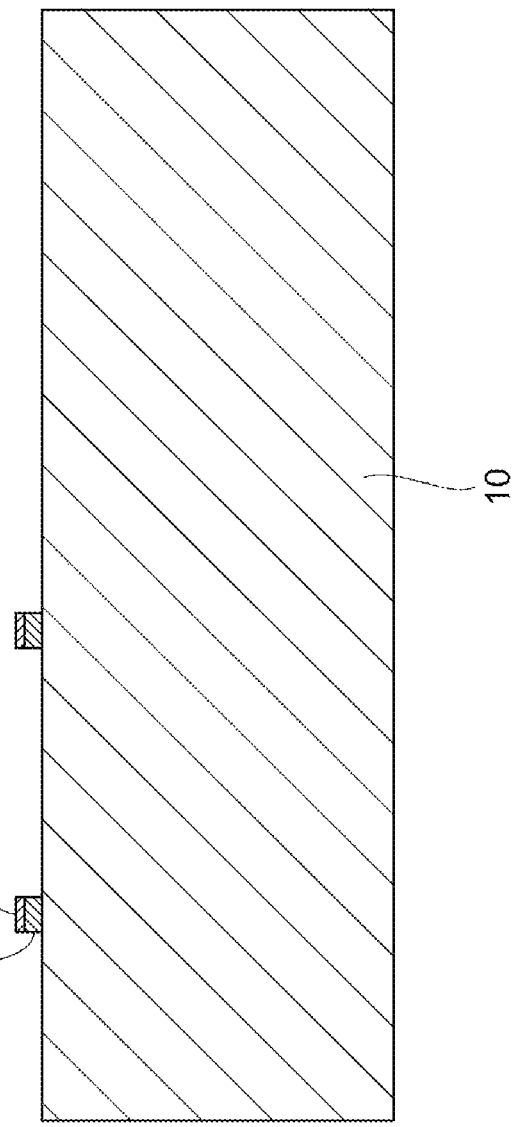

Then, a resist, which serves as a mask, is applied onto the semiconductor substrate 10. The semiconductor layer is exposed by wet etching or dry etching, and then, the resist is removed. As a result, emitter layers 81 of the transistors are formed as shown in FIG. 18B.

Figure 18C:
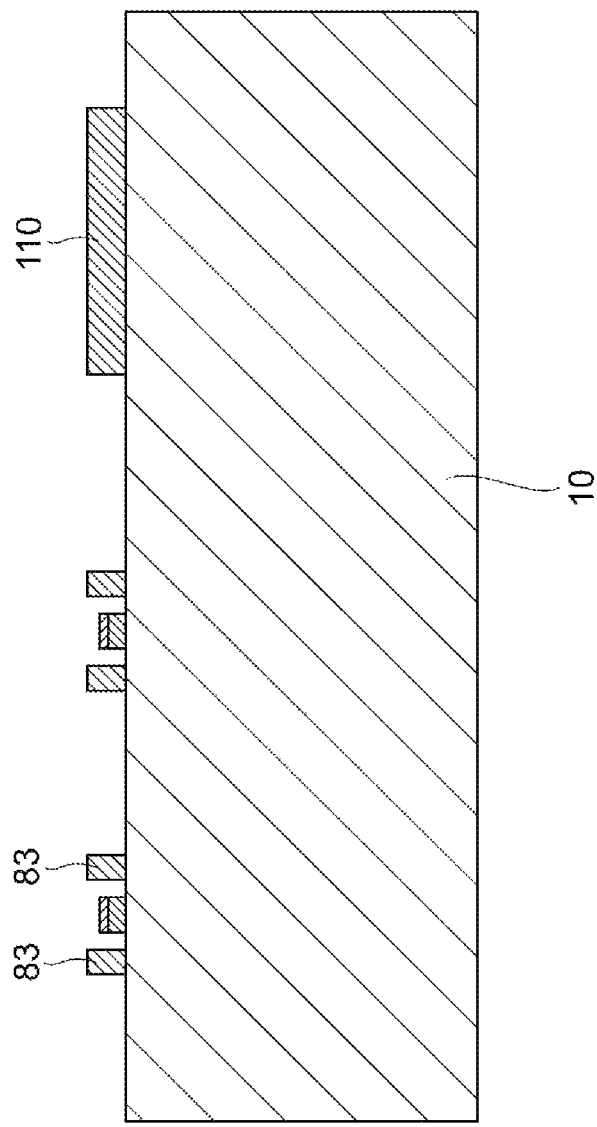

Then, a metal layer is formed on the semiconductor substrate 10 by deposition or sputtering, for example. As a result, as shown in FIG. 18C, base electrodes 83 of the transistors are formed, and a metal layer 110 for adjusting the height of the Cu pillar bump 30c is also formed.

Figure 18D:
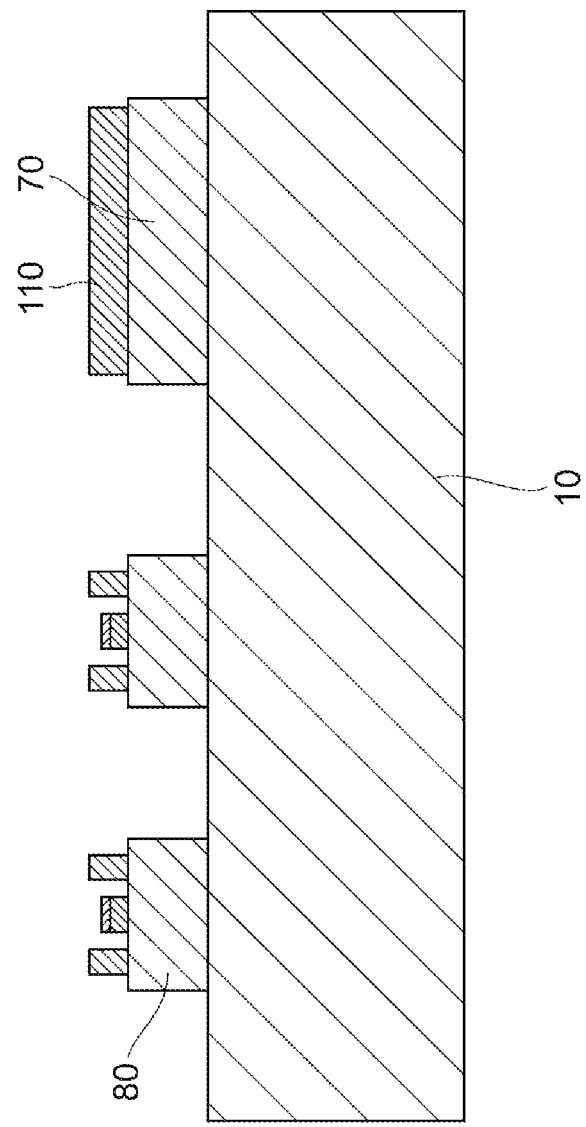

Then, the semiconductor layer is exposed by wet etching or dry etching. As a result, as shown in FIG. 18D, base layers 80 of the transistors are formed, and a semiconductor layer 70 for adjusting the height of the Cu pillar bump 30c is also formed.

Figure 18E:
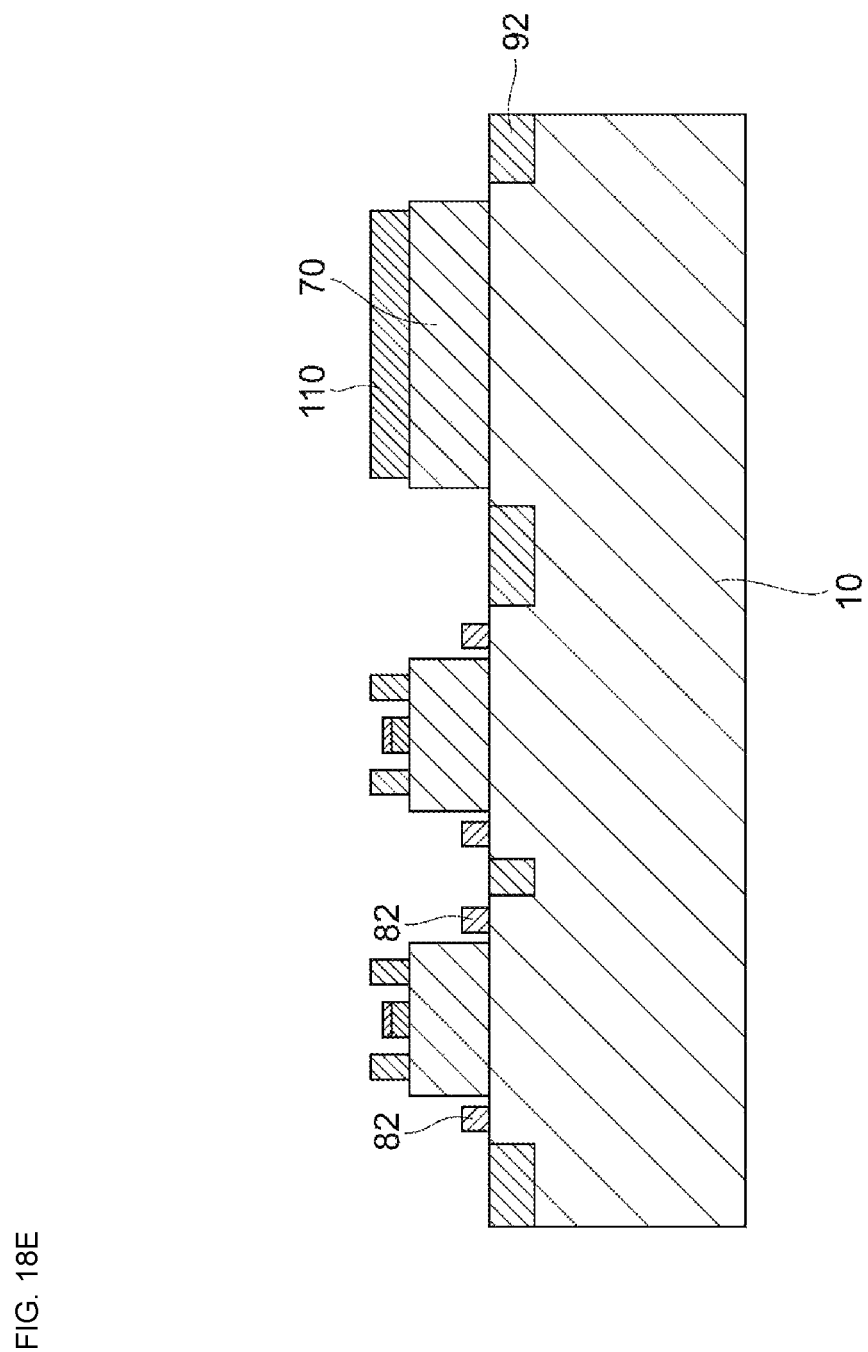

Then, a resist, which serves as a mask, is applied onto the semiconductor substrate 10. Isolation layers 92 are formed by ion implantation, as shown in FIG. 18E, and then, the resist is removed. A metal layer is formed by deposition or sputtering, for example. As a result, as shown in FIG. 18E, collector electrodes 82 of the transistors are formed.

Figure 18F:
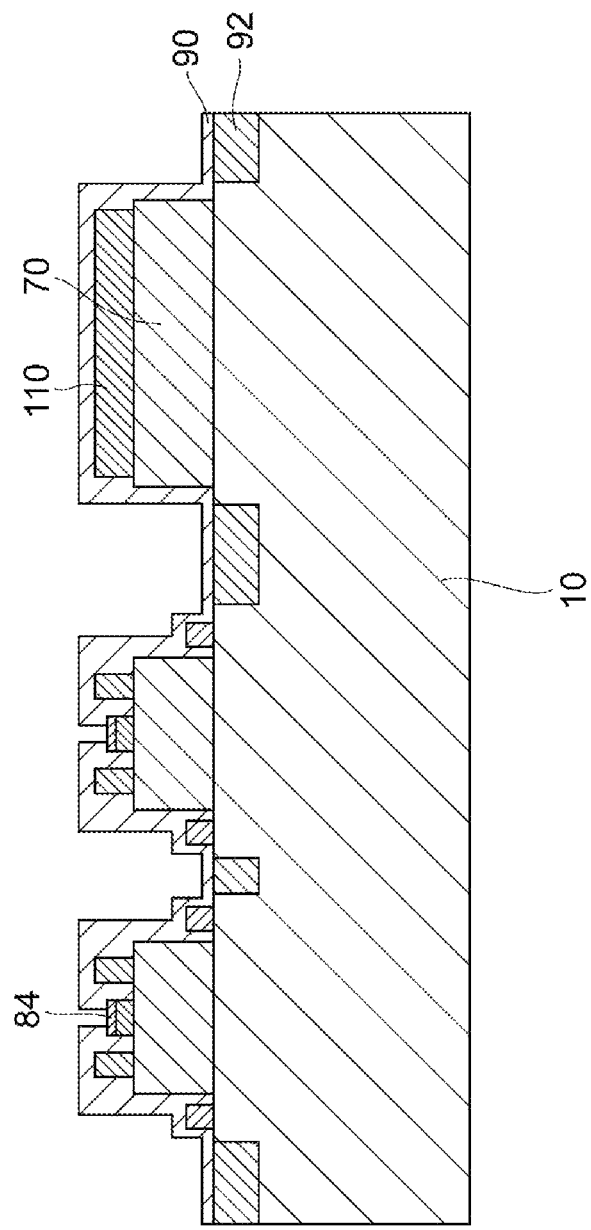

Then, as shown in FIG. 18F, an insulating layer 90, which serves as a protective film, is formed above the transistors 21d and 21e, the semiconductor layer 70, and the metal layer 110 by chemical vapor deposition (CVD), for example. The insulating layer 90 formed on part of each of the emitter electrodes 84 of the transistors is removed by dry etching so as to form cavities.

Figure 18G:
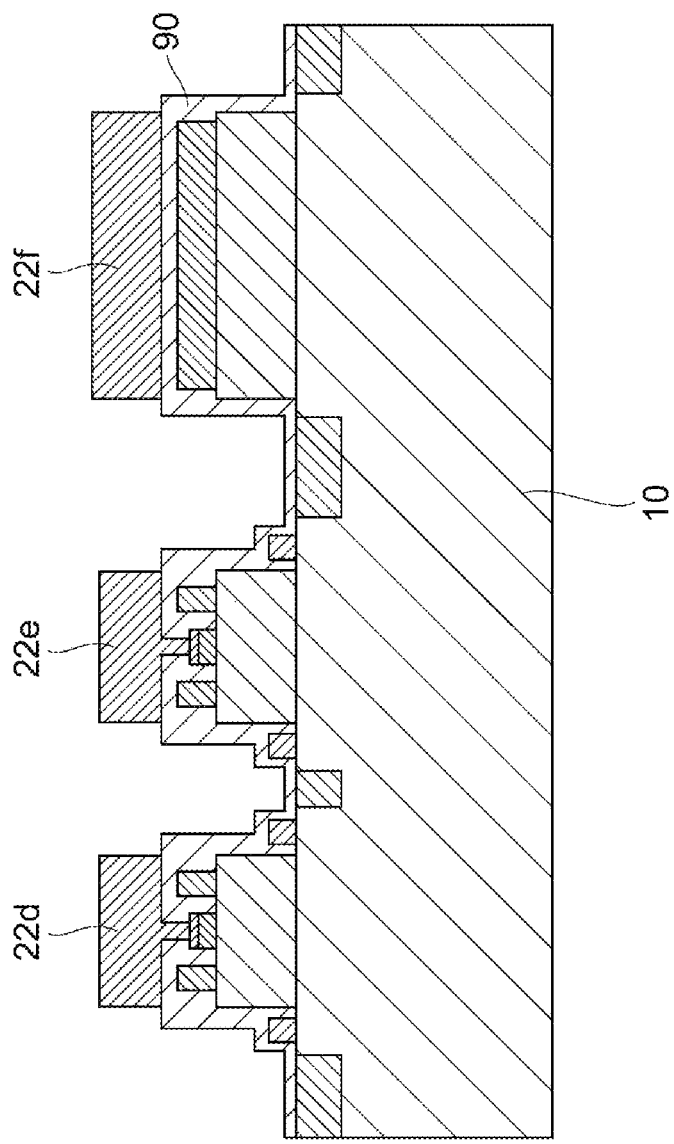

Then, as shown in FIG. 18G, electrodes 22d through 22f are formed on the insulating layer 90 by deposition or sputtering, for example.

Figure 18H:
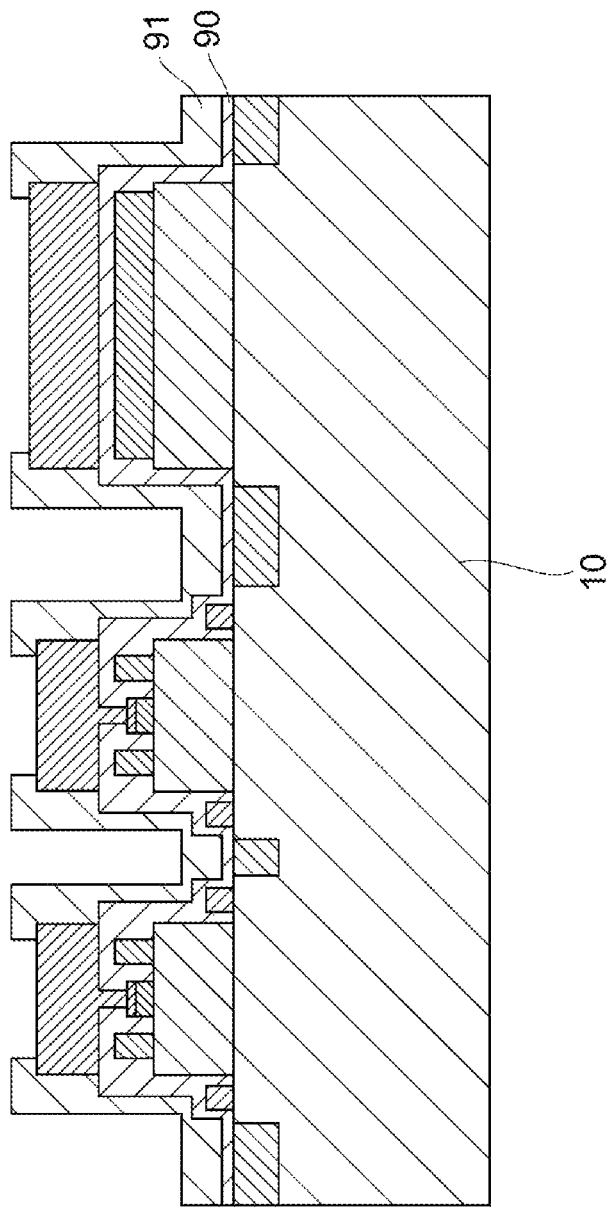

Then, as shown in FIG. 18H, an insulating layer 91 is formed above the electrodes 22d through 22f and the insulating layer 90 by CVD, for example. The insulating layer 91 formed on part of each of the electrodes 22d through 22f is removed by dry etching so as to form cavities.

Figure 18I:
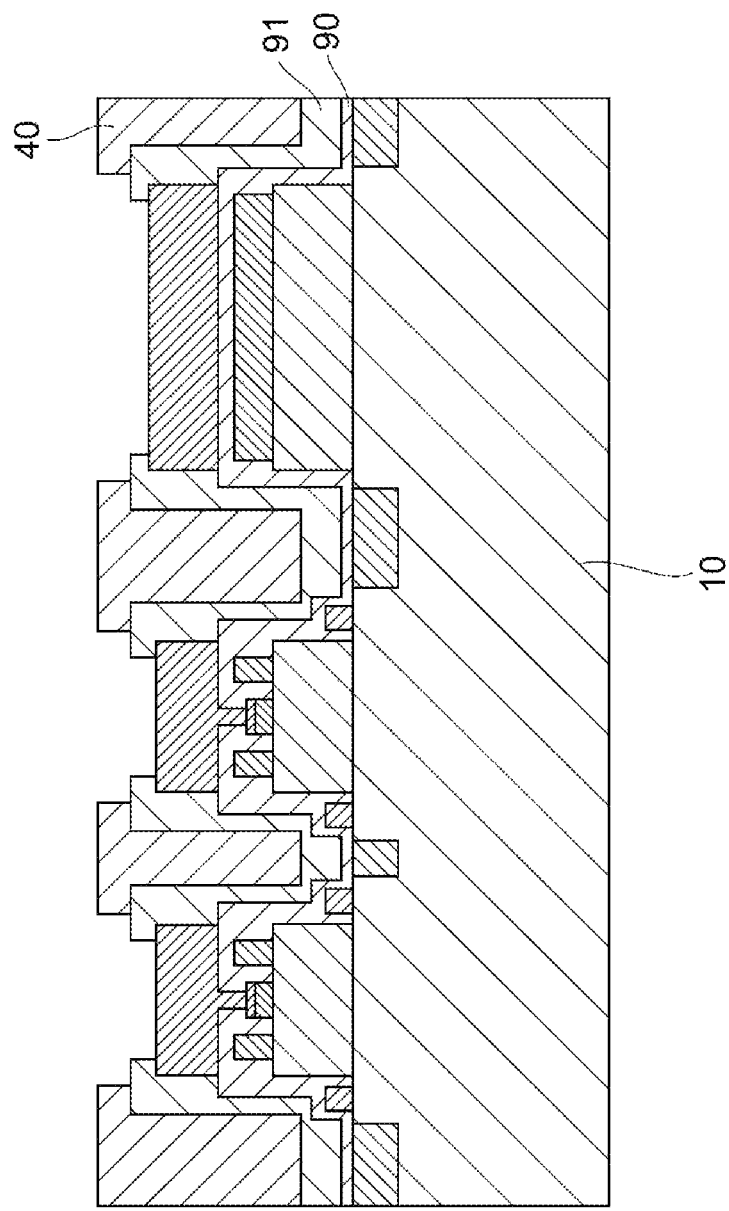

Then, a resin is applied and is then subjected to patterning and thermal treatment. As a result, a resin insulating layer 40 is formed as shown in FIG. 18I.

Figure 18J:
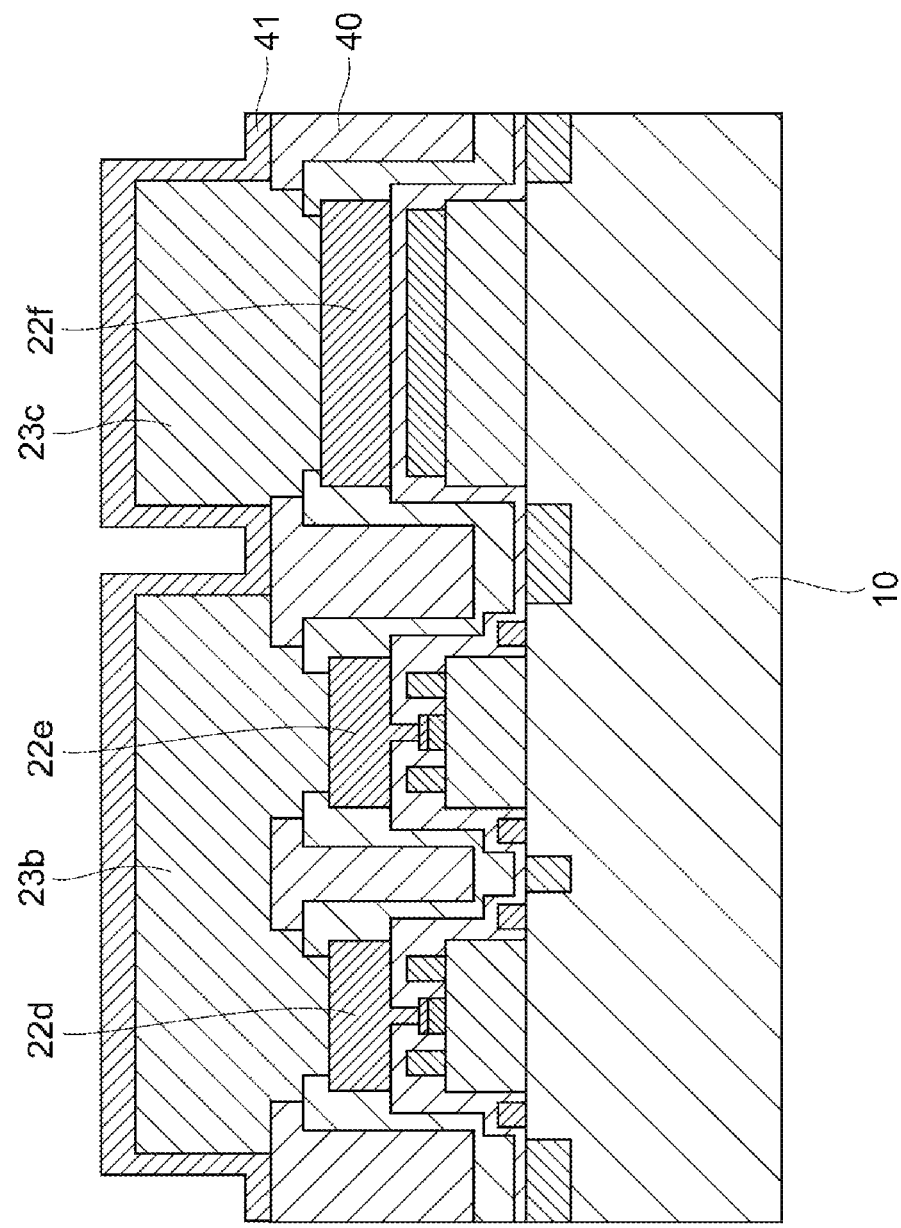

Finally, as shown in FIG. 18J, an electrode 23b is formed on the electrodes 22d and 22e, and an electrode 23c is formed on the electrode 22f by deposition or sputtering, for example. Then, an insulating layer 41 is formed by CVD, for example. The following steps are similar to those of the manufacturing method shown in FIGS. 9A through 9J, and an explanation thereof will thus be omitted.

According to the above-described manufacturing method, the semiconductor chip 100I including the Cu pillar bump 30c with the height adjusted can be manufactured. The manufacturing method for the semiconductor chip 100I is not restricted to this example. The semiconductor chips of other embodiments may be manufactured similarly according to the above-described manufacturing method.

The preferred embodiments of the disclosure have been discussed above. The semiconductor chips 100A through 100G each include electrodes 23a through 23c, a relatively large Cu pillar bump 30a, and relatively small Cu pillar bumps 30b and 30c. An insulating layer 50 is formed above one part of the electrode 23b, while insulating layers 51 and 52 are formed above one part of the electrode 23c. With this configuration, the heights of the Cu pillar bumps 30b and 30c can be adjusted. Even with a difference in the area of the Cu pillar bumps or a difference in the height of the circuit forming region, the heights of the Cu pillar bumps can be made substantially uniform without depending on the control of the amount of solder to be applied to the bumps.

In each of the semiconductor chips 100A through 100G, the longest distances from the main surface 11 of the semiconductor substrate 10 to the top surfaces of the Cu pillar bumps 30a, 30b, and 30c are equal to each other. Hence, the plural Cu pillar bumps 30a through 30c can uniformly be connected to a substrate when mounting the semiconductor chip on the substrate. This can relax the stress applied to the Cu pillar bumps 30a through 30c so as to improve the reliability in connecting the semiconductor chip to the substrate.

In the semiconductor chips 100A through 100G, the plating seed layer 24a is formed above part of the electrode 23a and under the Cu pillar bump 30a, the plating seed layer 24b is formed above part of the electrode 23b and under the Cu pillar bump 30b, and the plating seed layer 24c is formed above part of the electrode 23c and under the Cu pillar bump 30c. Forming of the plating seed layers 24b and 24c makes it possible to form the Cu pillar bumps 30b and 30c above the insulating layers 50 and 52 by plating.

In the semiconductor chips 100A through 100G, an insulating layer placed under a relatively small Cu pillar bump may be formed thicker than that under a relatively large Cu pillar bump. Then, the heights of the Cu pillar bumps may be made substantially uniform without depending on the control of the amount of solder to be applied to the bumps.

In the semiconductor chips 100A through 100G, the ratio of the area of an insulating layer placed under a relatively small Cu pillar bump may be set to be higher than that under a relatively large Cu pillar bump. Then, the heights of the Cu pillar bumps may be made substantially uniform without depending on the control of the amount of solder to be applied to the bumps.

In the semiconductor chips 100A through 100G, double layers constituted by the insulating layers 51 and 52 are formed under the Cu pillar bump 30c. This makes it possible to adjust the height of the smallest Cu pillar bump 30c to that of the largest Cu pillar bump 30a.

In the semiconductor chip 100C of the third embodiment, the transistors 21d and 21e are formed on the main surface 11 of the semiconductor substrate 10, and, immediately above the transistors 21d and 21e, the insulating layers 56 are not formed, but the plating seed layer 24b and the Cu pillar bump 30b are formed. The Cu layer 31b having a high thermal conductivity is formed immediately above the region where the transistors 21d and 21e, which generate a relatively large amount of heat, are disposed. The insulating layers 56 are formed above the region where the transistors 21d and 21e are not disposed. With this configuration, the height of the Cu pillar bump 30b can be adjusted while the heat dissipation characteristics of the Cu layer 31b are effectively utilized.

The Cu pillar bumps are not restricted to a particular configuration, and may include a Cu layer and a solder layer sequentially stacked on each other. The material for the semiconductor substrate 10 is not restricted to a particular material, and may contain a compound semiconductor, for example, as the principal component.

The semiconductor chips 100H through 100O each include a semiconductor substrate 10 having a main surface 11, a semiconductor layer 70 that is formed above the main surface 11 of the semiconductor substrate 10 and that does not form a transistor, a semiconductor layer that is formed above the main surface 11 of the semiconductor substrate 10 and that forms a base layer 80 of a transistor, an insulating layer 90 formed above the semiconductor layer 70, a Cu pillar bump 30c formed above the insulating layer 90, and a Cu pillar bump 30b formed above the base layer 80. In a plan view of the main surface 11 of the semiconductor substrate 10, the area of the Cu pillar bump 30b is larger than that of the Cu pillar bump 30c. By inserting and placing the semiconductor layer 70 under the smaller Cu pillar bump 30c, the heights of the Cu pillar bumps 30b and 30c having different areas can be made substantially uniform.

In the semiconductor chips 100H through 100O, the semiconductor layer 70 is not electrically connected to the Cu pillar bump 30c, while the base layer 80 is electrically connected to the Cu pillar bump 30b.

The semiconductor chip 100I of the ninth embodiment further includes a metal layer 110 formed above the semiconductor layer 70 and under the insulating layer 90. This can further increase the height of the Cu pillar bump 30c by the thickness of the metal layer 110.

The semiconductor chip 100O of the fifteenth embodiment further includes a TFR 120 formed near a semiconductor layer 76 side by side on the main surface 11 of the semiconductor substrate 10. At least part of the TFR 120 and at least part of the semiconductor layer 76 are formed under the Cu pillar bump 30c. The semiconductor layer 76 is not necessarily formed in the entire region under the Cu pillar bump 30c, and may be formed in part of the region under the Cu pillar bump 30c.

In the above-described embodiments, the bumps of the semiconductor chips are Cu pillar bumps. However, bumps are not limited to Cu pillar bumps, and may be another type of bump, such as gold bumps or solder bumps.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor chip comprising:
    a semiconductor substrate having a main surface;
    a first electrode formed above the main surface of the semiconductor substrate;
    a second electrode formed above the main surface of the semiconductor substrate;
    a first insulating layer formed above a first portion of the first electrode;
    a first bump that is formed above a second portion of the first electrode and above the first insulating layer, and that is electrically connected to the first electrode; and
    a second bump formed above the second electrode, an area of the second bump being larger than an area of the first bump in a plan view of the main surface of the semiconductor substrate,
    wherein a level on which the first bump is formed is higher than a level on which the second bump is formed.

2. The semiconductor chip according to claim 1, wherein a longest distance from the main surface of the semiconductor substrate to a top surface of the first bump in a direction normal to the main surface of the semiconductor substrate is substantially equal to a longest distance from the main surface of the semiconductor substrate to a top surface of the second bump in the direction normal to the main surface of the semiconductor substrate.

3. The semiconductor chip according to claim 1, further comprising:
    a first metal layer that is formed above the second portion of the first electrode and above the first insulating layer, and the first bump is formed above the first metal layer; and
    a second metal layer formed above the second electrode, and the second bump is formed above the second metal layer.

4. The semiconductor chip according to claim 1, further comprising:
    a second insulating layer formed above a first portion of the second electrode and under the second bump,
    wherein a thickness of the first insulating layer in a direction normal to the main surface of the semiconductor substrate is greater than a thickness of the second insulating layer in the direction normal to the main surface of the semiconductor substrate.

5. The semiconductor chip according to claim 1, further comprising:
    a second insulating layer formed above a first portion of the second electrode and under the second bump,
    wherein, in a plan view of the main surface of the semiconductor substrate, a ratio of an area of the first insulating layer to the area of the first bump is greater than a ratio of an area of the second insulating layer to the area of the second bump.

6. The semiconductor chip according to claim 1, further comprising:
    a third insulating layer formed above the first insulating layer and under the first bump.

7. The semiconductor chip according to claim 1, further comprising:
    a transistor formed above the main surface of the semiconductor substrate, wherein
    the first electrode is formed above the transistor, and
    the second portion of the first electrode is positioned immediately above the transistor.

8. The semiconductor chip according to claim 1, wherein the first and second bumps are copper pillar bumps.

9. The semiconductor chip according to claim 8, wherein the first bump includes a copper layer and a solder layer sequentially stacked above the first electrode, and the second bump includes a copper layer and a solder layer sequentially stacked above the second electrode.

10. The semiconductor chip according to claim 1, wherein the semiconductor substrate includes a compound semiconductor.

11. The semiconductor chip according to claim 2, further comprising:

a first metal layer that is formed above the second portion of the first electrode and above the first insulating layer, and the first bump is formed above the first metal layer; and a second metal layer formed above the second electrode, and the second bump is formed above the second metal layer.

12. The semiconductor chip according to claim 2, further comprising:

a second insulating layer formed above a first portion of the second electrode and under the second bump, wherein a thickness of the first insulating layer in a direction normal to the main surface of the semiconductor substrate is greater than a thickness of the second insulating layer in the direction normal to the main surface of the semiconductor substrate.

13. The semiconductor chip according to claim 2, further comprising:

a second insulating layer formed above a first portion of the second electrode and under the second bump, wherein, in a plan view of the main surface of the semiconductor substrate, a ratio of an area of the first insulating layer to the area of the first bump is greater than a ratio of an area of the second insulating layer to the area of the second bump.

14. The semiconductor chip according to claim 2, further comprising:

a third insulating layer formed above the first insulating layer and under the first bump.

15. The semiconductor chip according to claim 2, further comprising:

a transistor formed above the main surface of the semiconductor substrate, wherein the first electrode is formed above the transistor, and the second portion of the first electrode is positioned immediately above the transistor.

16. A semiconductor chip comprising:

a semiconductor substrate having a main surface that includes a transistor forming portion on which a transistor is formed and a non-transistor portion;

a first semiconductor layer that is formed above the non-transistor portion of the main surface of the semiconductor substrate;

a second semiconductor layer that is formed above the transistor forming portion of the main surface of the semiconductor substrate and that forms a base layer of the transistor;

an insulating layer formed above the first semiconductor layer;

a first bump formed above the insulating layer; and a second bump formed above the second semiconductor layer, wherein an area of the second bump is larger than an area of the first bump in a plan view of the main surface of the semiconductor substrate.

17. The semiconductor chip according to claim 16, wherein the first semiconductor layer is not electrically connected to the first bump, while the second semiconductor layer is electrically connected to the second bump.

18. The semiconductor chip according to claim 16, further comprising:

a metal layer formed above the first semiconductor layer and under the insulating layer.

19. The semiconductor chip according to claim 16, further comprising:

an element that is formed near the first semiconductor layer side by side above the main surface of the semiconductor substrate, wherein at least part of the element and at least part of the first semiconductor layer are formed under the first bump.

* * * * *